US012111580B2

(12) United States Patent
Manassen et al.

(10) Patent No.: US 12,111,580 B2
(45) Date of Patent: Oct. 8, 2024

(54) OPTICAL METROLOGY UTILIZING SHORT-WAVE INFRARED WAVELENGTHS

(71) Applicant: KLA Corporation, Milpitas, CA (US)

(72) Inventors: Amnon Manassen, Haifa (IL); Isaac Salib, Milpitas, CA (US); Raviv Yohanan, Qiryat Motzkin (IL); Diana Shaphirov, Yoqneam Illit (IL); Eitan Hajaj, Tel Aviv (IL); Vladimir Levinski, Nazareth Ilit (IL); Avi Abramov, Haifa (IL); Michael Shentcis, Milpitas, CA (US); Ariel Hildesheim, Milpitas, CA (US); Yoav Grauer, Milpitas, CA (US); Shlomo Eisenbach, Milpitas, CA (US); Etay Lavert, Milpitas, CA (US); Iftach Nir, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 384 days.

(21) Appl. No.: 17/243,912

(22) Filed: Apr. 29, 2021

(65) Prior Publication Data
US 2022/0291143 A1 Sep. 15, 2022

Related U.S. Application Data

(60) Provisional application No. 63/159,451, filed on Mar. 11, 2021.

(51) Int. Cl.
*G03F 7/00* (2006.01)
*G01B 11/27* (2006.01)
(Continued)

(52) U.S. Cl.
CPC ...... *G03F 7/706851* (2023.05); *G01B 11/272* (2013.01); *G01N 21/35* (2013.01);
(Continued)

(58) Field of Classification Search
CPC .. G01N 21/35; G01N 21/956; G01N 21/9501; G01N 21/9505; G03F 7/70605;
(Continued)

(56) References Cited

U.S. PATENT DOCUMENTS 6,023,338 A 2/2000 Bareket
6,597,006 B1 * 7/2003 McCord ............. G01B 11/0625
250/559.19
(Continued)

OTHER PUBLICATIONS

Dutta, Jaydeep K. et al., "Analytical model for design-optimization and performances of fabricated broadband (VIS-SWIR) photodetector for image sensor and optical communication applications," Proc. SPIE 10656, Image Sensing Technologies: Materials, Devices, Systems, and Applications V, 106560N (May 15, 2018), 10 pages.
(Continued)

*Primary Examiner* — Gordon J Stock, Jr.
(74) *Attorney, Agent, or Firm* — Suiter Swantz IP

(57) ABSTRACT

An optical metrology tool may include one or more illumination sources to generate illumination having wavelengths both within a short-wave infrared (SWIR) spectral range and outside the SWIR spectral range, illumination optics configured to direct the illumination to a sample, a first imaging channel including a first detector configured to image the sample based on a first wavelength range including at least some wavelengths in the SWIR spectral range, a second imaging channel including a second detector configured to image the sample based on a second wavelength range including at least some wavelengths outside the SWIR spectral range, and a controller. The controller may receive first images of the sample from the first detector, receive second images of the sample from the second detector, and generate an optical metrology measurement of the sample based on the first and second images.

38 Claims, 12 Drawing Sheets

(51) Int. Cl.
*G01N 21/35* (2014.01)
*G01N 21/956* (2006.01)

(52) U.S. Cl.
CPC ....... *G01N 21/956* (2013.01); *G03F 7/70625* (2013.01); *G03F 7/70633* (2013.01); *G03F 7/70683* (2013.01)

(58) Field of Classification Search
CPC ............ G03F 7/70608; G03F 7/70616; G03F 7/70625; G03F 7/70633; G03F 7/70641; G03F 7/7065; G03F 7/70653; G03F 7/70681; G03F 7/70683; G03F 7/706843; G03F 7/706847; G03F 7/706849; G03F 7/706851; G01B 11/14; G01B 11/26; G01B 11/27; G01B 11/272
See application file for complete search history.

(56) References Cited

U.S. PATENT DOCUMENTS

| | | | |
|---|---|---|---|
| 7,369,235 B1 | 5/2008 | Janik et al. | |
| 7,684,039 B2 | 3/2010 | Adel et al. | |
| 7,879,627 B2 | 2/2011 | Ghinovker et al. | |
| 9,835,956 B2* | 12/2017 | Liu | G01B 11/272 |
| 9,921,104 B2* | 3/2018 | Krishnan | G01J 3/447 |
| 10,042,269 B2* | 8/2018 | Yue | G01B 9/0203 |
| 10,228,320 B1* | 3/2019 | Levinski | G06F 30/00 |
| 10,444,161 B2 | 10/2019 | Manassen et al. | |
| 10,527,951 B2 | 1/2020 | Yohanan et al. | |
| 10,809,632 B2 | 10/2020 | Boef et al. | |
| 11,346,657 B2 | 5/2022 | Manassen et al. | |
| 11,360,399 B2* | 6/2022 | Goorden | G03F 7/70583 |
| 11,428,642 B2* | 8/2022 | Hill | G01N 21/8851 |
| 11,531,275 B1* | 12/2022 | Hill | G03F 7/70491 |
| 11,726,046 B2* | 8/2023 | Jung | H01L 22/20 |
| | | | 356/237.2 |
| 2003/0071996 A1 | 4/2003 | Wang et al. | |
| 2007/0091325 A1* | 4/2007 | Nikoonahad | G01N 21/95623 |
| | | | 356/625 |
| 2014/0254916 A1* | 9/2014 | Lee | H04N 23/11 |
| | | | 382/145 |
| 2014/0291493 A1* | 10/2014 | Chuang | H01J 43/08 |
| | | | 257/431 |
| 2016/0061750 A1* | 3/2016 | Den Boef | G03F 7/70141 |
| | | | 356/496 |
| 2018/0052099 A1* | 2/2018 | Hill | G01J 3/10 |
| 2018/0238814 A1* | 8/2018 | Sapiens | G03F 7/70616 |
| 2019/0285407 A1* | 9/2019 | Chuang | G03F 7/70633 |
| 2019/0310080 A1* | 10/2019 | Hill | G01B 11/272 |
| 2020/0124408 A1 | 4/2020 | Hill et al. | |
| 2020/0243400 A1* | 7/2020 | Wang | G01N 21/9501 |
| 2020/0409271 A1 | 12/2020 | Hill et al. | |
| 2021/0055098 A1 | 2/2021 | Yamaki et al. | |
| 2021/0072650 A1 | 3/2021 | Feler et al. | |
| 2021/0096061 A1* | 4/2021 | Hill | G06T 7/0004 |
| 2022/0172347 A1* | 6/2022 | Tukker | G03F 7/70616 |
| 2022/0276180 A1* | 9/2022 | Pandey | G01J 3/36 |
| 2023/0008139 A1* | 1/2023 | Swillam | G03F 9/7088 |

OTHER PUBLICATIONS

International Search Report and Written Opinion in PCT/US2022/017787 dated Jun. 8, 2022, 11 pages.

* cited by examiner

OPTICAL METROLOGY UTILIZING SHORT-WAVE INFRARED WAVELENGTHS

CROSS-REFERENCE TO RELATED APPLICATION

The present application claims the benefit under 35 U.S.C. § 119(e) of U.S. Provisional Application Ser. No. 63/159,451 filed Mar. 11, 2021, which is incorporated herein by reference in the entirety.

TECHNICAL FIELD

The present disclosure relates generally to optical metrology and, more particularly, to optical metrology utilizing short-wave infrared (SWIR) wavelengths.

BACKGROUND

Semiconductor process roadmaps are shifting to include sample layers that exhibit less transparency to visible wavelengths but increasing transparency to short-wave infrared (SWIR) wavelengths. As a result, optical metrology techniques based on visible wavelengths of light may produce lower signal intensities and higher noise, which may negatively impact measurement accuracy and throughput. It is therefore desirable to provide systems and methods to cure the above deficiencies.

SUMMARY

An optical metrology tool is disclosed in accordance with one or more illustrative embodiments of the present disclosure. In one illustrative embodiment, the tool includes one or more illumination sources, where at least one of the one or more illumination sources generates illumination in a short-wave infrared (SWIR) spectral range, and where at least one of the one or more illumination sources generates illumination outside the SWIR spectral range. In another illustrative embodiment, the tool includes one or more illumination optics to direct illumination from the one or more illumination sources to a sample. In another illustrative embodiment, the tool includes a first imaging channel including a first detector to image the sample based on illumination with a first wavelength range, where the first wavelength range includes at least some wavelengths in the SWIR spectral range from the one or more illumination sources. In another illustrative embodiment, the tool includes a second imaging channel including a second detector to image the sample based on illumination with a second wavelength range different than the first wavelength range, where the second wavelength range includes at least some wavelengths outside the SWIR spectral range from the one or more illumination sources. In another illustrative embodiment, the tool includes a controller. In another illustrative embodiment, the controller receives one or more first images of the sample from the first detector. In another illustrative embodiment, the controller receives one or more second images of the sample from the second detector. In another illustrative embodiment, the controller generates one or more optical metrology measurements of the sample based on the one or more first images and the one or more second images.

An optical metrology tool is disclosed in accordance with one or more illustrative embodiments of the present disclosure. In one illustrative embodiment, the tool includes one or more illumination sources, where at least one of the one or more illumination sources generates illumination in a short-wave infrared (SWIR) spectral range, and where at least one of the one or more illumination sources generates illumination outside the SWIR spectral range. In another illustrative embodiment, the tool includes one or more illumination optics to direct illumination from the one or more illumination sources to a sample. In another illustrative embodiment, the tool includes a first imaging channel, where the first imaging channel includes a first detector to image the sample based on illumination with a first wavelength range, and where the first wavelength range includes at least some wavelengths in the SWIR spectral range from the one or more illumination sources. In another illustrative embodiment, the first imaging channel further includes a second detector configured to image the sample based on illumination with a second wavelength range different than the first wavelength range, where the second wavelength range includes at least some wavelengths outside the SWIR spectral range from the one or more illumination sources. In another illustrative embodiment, the first detector and the second detector are mounted on a camera changer to selectively position the first detector or the second detector in a collection path for imaging the sample. In another illustrative embodiment, the tool includes a second imaging channel including a third detector configured to image the sample based on illumination with a third wavelength range different than the first wavelength range, wherein the third wavelength range includes at least some wavelengths outside the SWIR spectral range from the one or more illumination sources. In another illustrative embodiment, the tool includes a controller. In another illustrative embodiment, the controller receives one or more first images of the sample from the first detector. In another illustrative embodiment, the controller receives one or more second images of the sample from the second detector. In another illustrative embodiment, the controller receives one or more third images of the sample from the third detector. In another illustrative embodiment, the controller generates one or more optical metrology measurements of the sample based on the one or more first images, the one or more second images, and the one or more third images.

An optical metrology tool is disclosed in accordance with one or more illustrative embodiments of the present disclosure. In one illustrative embodiment, the tool includes one or more illumination sources, where at least one of the one or more illumination sources generates illumination in a short-wave infrared (SWIR) spectral range, and where at least one of the one or more illumination sources generates illumination outside the SWIR spectral range. In another illustrative embodiment, the tool includes one or more illumination optics to direct illumination from the one or more illumination sources to a sample. In another illustrative embodiment, the tool includes a detector sensitive to at least some wavelengths in the SWIR spectral range generated by the one or more illumination sources and at least some wavelengths outside the SWIR spectral range generated by the one or more illumination sources. In another illustrative embodiment, the tool includes a controller. In another illustrative embodiment, the controller receives one or more first images of the sample from the detector based on illumination with the at least some wavelengths in the SWIR spectral range generated by the one or more illumination sources. In another illustrative embodiment, the controller receives one or more second images of the sample from the second detector based on illumination with the at least some wavelengths outside the SWIR spectral range generated by the one or more illumination sources. In another illustrative embodiment, the controller generates one or more optical metrology measurements of the sample based on the one or more first images and the one or more second images.

An overlay metrology target is disclosed in accordance with one or more illustrative embodiments of the present disclosure. In one illustrative embodiment, the target includes one or more first-layer features in a first layer of a sample. In another illustrative embodiment, the target includes one or more second-layer features in a second layer of the sample, where the second layer of the sample is disposed on top of the first layer of the sample. In another illustrative embodiment, at least a portion of the sample covering the first-layer features is formed from a material that absorbs at least some illumination having visible wavelengths and transmits at least some illumination having short-wave infrared (SWIR) wavelengths. In another illustrative embodiment, the one or more first-layer features and the one or more second-layer features are arranged to provide an overlay measurement of a relative alignment of the first and second layers of the sample based on one or more first images of the one or more first-layer features and one or more second images of the one or more second-layer features. In another illustrative embodiment, the one or more first-layer images are formed with illumination including the SWIR wavelengths and a first imaging detector sensitive to at least the SWIR wavelengths. In another illustrative embodiment, the one or more second-layer images are formed with illumination including the visible wavelengths and a second imaging detector sensitive to at least the visible wavelengths.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
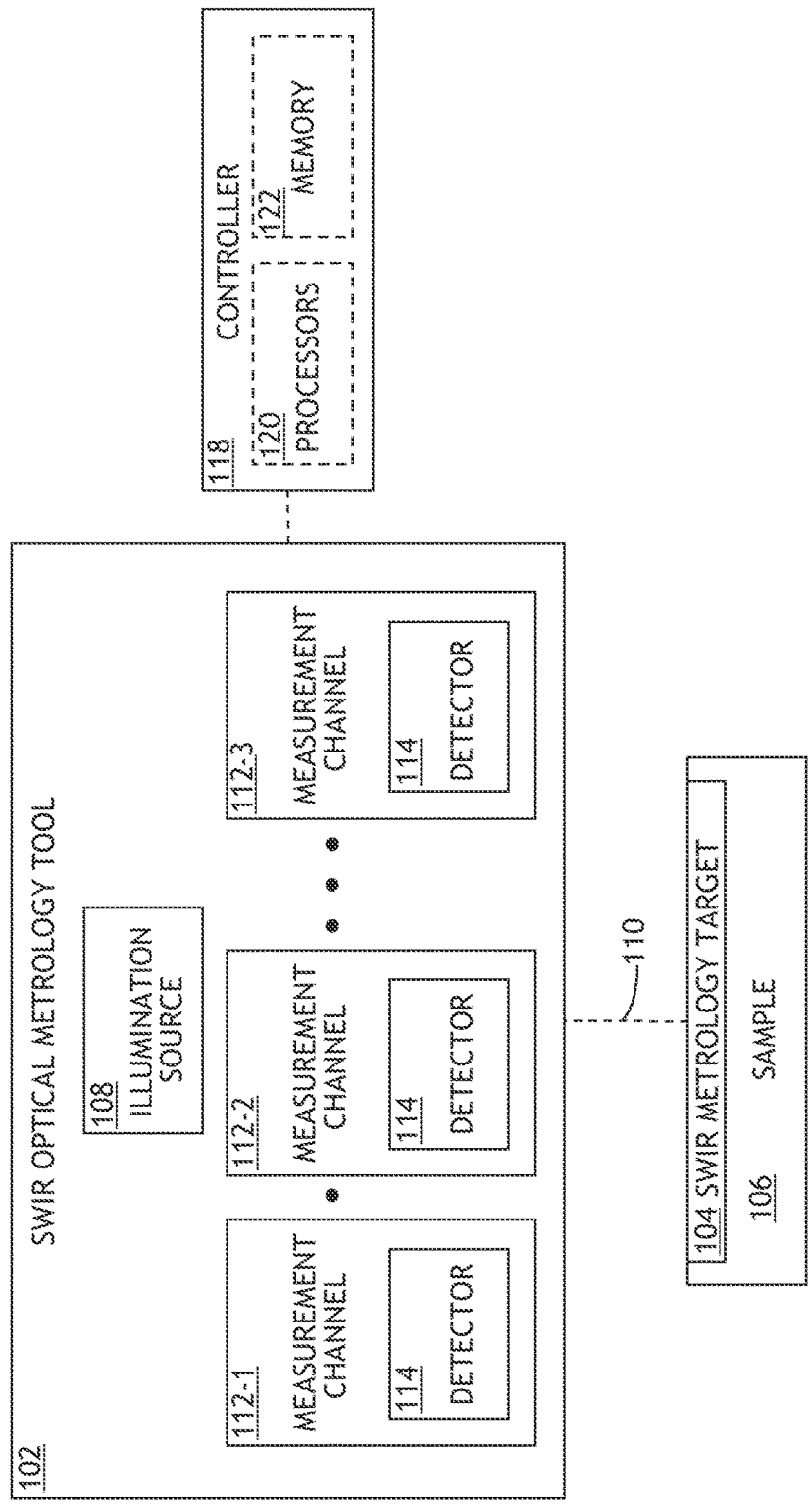
FIG. 1A is a conceptual block-diagram view of a SWIR optical metrology system utilizing illumination with at least one wavelength in a SWIR spectral range, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for implementing optical metrology using short-wave infrared (SWIR) wavelengths. The SWIR spectral range is generally considered to include wavelengths ranging from around 700 nanometers (nm) to around 3000 nm, noting that wavelengths ranging from approximately 750 nm to around 900 nm (e.g., near an upper limit of the sensitivity of silicon-based detectors) or sometimes up to 1100 nm or 1400 nm are sometimes designated near infrared (NIR) light. For the purposes of the present disclosure, the SWIR spectral range is broadly considered to include wavelengths ranging from around 700 nanometers (nm) to around 3000 nm. It is contemplated that the systems and methods disclosed herein may be suitable for any optical metrology technique known in the art. In this way, the systems and methods disclosed herein may extend existing optical metrology techniques currently operating in the ultraviolet (UV) to infrared (IR) spectral ranges to be able to operate in a SWIR spectral range.

For the purposes of the present disclosure, the term optical metrology is used to broadly refer to metrology based on illumination of a sample with light, capturing light from the sample in response to the illumination (e.g., in the form of images or discrete measurements), and generating one or more measurements of the sample based on the captured light. Considering semiconductor device manufacturing as a non-limiting example, optical metrology may include, but is not limited to overlay metrology or optical critical dimension (OCD) metrology.

Extending optical metrology measurements to SWIR wavelengths may improve the measurement accuracy and/or robustness relative to visible wavelengths. As an illustrative example based on overlay measurements, many optical overlay techniques are sensitive to various asymmetries an overlay target in addition to overlay errors. For instance, optical overlay techniques may be sensitive to asymmetries in the geometry of printed features themselves such as, but not limited to, asymmetries of the sidewall angles. As a result, such overlay techniques must typically be performed under highly-controlled conditions to limit unwanted feature asymmetries, be calibrated based on known feature asymmetries, and/or include multiple measurements under different conditions (e.g., different illumination conditions, different sample rotations, or the like) to isolate the impact of overlay errors for an overlay measurement. However, it is contemplated herein that sensitivity to asymmetries of the printed features generally decreases for longer wavelengths. As a result, overlay measurements using SWIR wavelengths may decouple the impact of overlay error from other feature asymmetries and may provide measurements that more accurately correspond to overlay errors on the sample.

Embodiments of the present disclosure are directed to performing optical metrology measurements with one or more detectors sensitive to SWIR wavelengths (e.g., SWIR detectors). For example, a SWIR detector may include a focal plane array (FPA) sensitive to SWIR wavelengths. It is recognized herein that some overlay techniques have been extended to the NIR spectral range. For example, overlay metrology in the near-IR spectral range is described generally in U.S. Pat. No. 7,684,039 issued on Mar. 23, 2010, which is incorporated herein by reference in its entirety. However, recent advances in cameras sensitive to SWIR wavelengths such as, but not limited to, Indium-Gallium-Arsenide (InGaAs) detectors or Mercury-Cadmium-Telluride (HgCdTe or MCT) detectors may render such cameras feasible for integration into overlay metrology systems. In this regard, various optical metrology techniques may be extended to include SWIR wavelengths.

In some embodiments, a SWIR camera is added as an extension to an existing system (e.g., operating in the UV, visible, IR, or NIR spectral ranges). For example, an additional measurement channel with the SWIR camera may be added to an existing system. By way of another example, an existing camera and a SWIR camera may be mounted on a camera switcher (e.g., a device suitable for swapping one camera for the other). In this way, a user or automated system may selectively switch between the existing camera and the SWIR camera.

In some embodiments, a SWIR camera may replace and/or supplement existing cameras (e.g., operating in the UV, visible, or IR spectral ranges). For example, it is contemplated herein that optical metrology including both a visible camera and a SWIR camera may provide enhanced sensitivity in spectral regions for which the quantum efficiency for one or both cameras is relatively low. For instance, the quantum efficiency of silicon-based detectors may generally be high for visible wavelengths above 400 nm, but may generally deteriorate for wavelengths above 700 nm. In contrast, the quantum efficiency of a SWIR detector such as an InGaAs detector may be relatively poor at 400 nm, but may generally improve for longer wavelengths. However, the quantum efficiency of an InGaAs detector may be equal to or exceed that of a silicon detector for wavelengths in the range of 700-750 nm. In this way, a SWIR detector may replace and/or supplement visible-wavelength detectors in certain spectral regions. By way of another example, a single SWIR sensor may have a sufficient quantum efficiency over a full spectral range of interest including SWIR wavelengths and non-SWIR wavelengths. For example, a SWIR detector may include a SWIR-VIS sensor such as, but not limited to, an InGaAs sensor with an InP thickness selected to provide sensitive to visible wavelengths of interest. A SWIR-VIS InGaAs sensor is described generally in Jaydeep K. Dutta, et al., "Analytical model for design-optimization and performances of fabricated broadband (VIS-SWIR) photodetector for image sensor and optical communication applications," Proc. SPIE 10656, Image Sensing Technologies: Materials, Devices, Systems, and Applications V, 106560N (15 May 2018), which is incorporated herein by reference in its entirety.

Additional embodiments of the present disclosure are directed to SWIR metrology tools utilizing illumination with at least some SWIR wavelengths. In one embodiment, a SWIR optical metrology tool includes at least one illumination source to generate SWIR illumination and at least one measurement channel with a SWIR detector sensitive to the SWIR illumination such as, but not limited to, an InGaAs detector or a HgCdTe detector. For example, a SWIR optical metrology tool may include a single measurement channel suitable for providing overlay measurements based on illumination with at least some SWIR wavelengths. By way of another example, a SWIR optical metrology tool may include two or more measurement channels, wherein at least one of the measurement channels is suitable for providing overlay measurements based on illumination with at least some SWIR wavelengths. In a general sense, a SWIR metrology tool may be sensitive to and may thus provide measurements based on non-SWIR spectral ranges as well as SWIR spectral ranges. For example, a SWIR optical metrology tool may provide measurements based on UV, visible, IR, and/or NIR wavelengths in addition to SWIR wavelengths.

Additional embodiments of the present disclosure are directed to SWIR optical metrology tools providing multi-wavelength illumination and collection, where the multi-wavelength illumination includes at least one SWIR wavelength. It is contemplated herein that under highly controlled conditions and an "ideal" metrology target, an optical metrology measurement may generally be wavelength-independent. In many practical applications, optical metrology measurements may differ when generated using different wavelengths. However, in some cases, multiple optical metrology measurements generated with different wavelengths may be combined or otherwise analyzed together to provide a final overlay measurement that may be more accurate or more robust to fluctuations in target or measurement conditions than a single measurement at a single wavelength.

Multi-wavelength optical metrology measurements may be generated using various techniques within the spirit and scope of the present disclosure. In one embodiment, the SWIR optical metrology tool may include a camera switcher (e.g., controllable beam-directing optics, a translation stage to selectively place different detectors in a collection path, or the like) to provide sequential capture of measurement signals. In another embodiment, a SWIR optical metrology tool includes two or more measurement channels, where at least one measurement channel includes a SWIR detector. With this configuration, a SWIR optical metrology tool may simultaneously or sequentially generate metrology signals in each channel. For instance, the SWIR optical metrology tool may include one or more beamsplitters (e.g., wavelength-sensitive beamsplitters) to direct measurement light in different spectral bands to different detectors. This may allow for simultaneous capture of measurement signals associated with different spectral ranges when the sample is simultaneously illuminated with light in each spectral range and sequential capture of measurement signals when the sample is sequentially illuminated with light in each spectral range.

It is further contemplated herein that various cutoff wavelengths between measurement channels may be selected within the spirit and scope of the present disclosure. In some embodiment, a cutoff wavelength is based on a transition between a SWIR spectral range and a non-SWIR spectral range. For example, a cutoff wavelength may be in the range of 700 nm to 1100 nm. By way of another example, a cutoff wavelength may be in the range of 700 nm to 1400 nm. In some embodiments, a cutoff wavelength is selected based on the limits of a visible-wavelength detector. For example, the silicon-based detectors may generally be limited to wavelengths below approximately 900 nm. In one embodiment, a SWIR optical metrology tool includes a first measurement channel including a SWIR detector and a second measurement channel including a visible-wavelength detector, where a cutoff wavelength between the first and second measurement channels is selected to be approximately 900 nm. In this way, the first measurement channel including the SWIR detector may capture metrology data at wavelengths inaccessible to the visible-wavelength detector in the second measurement channel.

In some embodiments, a cutoff wavelength is selected based on the quantum efficiencies of detectors in various channels. For example, as described previously herein, the quantum efficiency of an InGaAs detector may be equal to or exceed that of a silicon detector above wavelengths in the range of 700-750 nm. In one embodiment, a SWIR optical metrology tool includes a first measurement channel including a SWIR detector and a second measurement channel including a visible-wavelength detector, where a cutoff wavelength between the first and second measurement channels is selected to be approximately 700 nm. In this way, the first measurement channel including the SWIR detector may capture metrology data for some wavelengths accessible to the visible-wavelength detector in the second measurement channel, but where the SWIR detector has higher quantum efficiency.

Additional embodiments of the present disclosure are directed to optical metrology measurements on a sample including one or more layers that are at least partially opaque to visible wavelengths but at least partially transparent to SWIR wavelengths, which are referred to herein as visibly-opaque IR-transparent layers, or VOIT layers. It is contemplated herein that VOIT layers are becoming increasingly common in both processing steps and/or device designs, which may impose constraints on the use of overlay measurement techniques utilizing only visible wavelengths of illumination. For example, a VOIT layer may block or otherwise reduce optical signals associated with any features on deeper layers. In the case of image-based techniques, images of sample features below a VOIT layer may have poor contrast. In the case of scatterometry or diffraction-based techniques, diffraction orders associated with sample features below a VOIT layer may have relatively low intensity. In either case, the use of such VOIT layers may decrease the signal to noise ratio of techniques based on light with visible wavelengths.

Examples of VOIT layers that may be suitable for characterization with an optical metrology measurement technique including SWIR wavelength light include, but are not limited to, hard photomask layers, carbon layers (e.g., carbon cap layers), or thick material layers. For example, VOIT layer may include a hard photomask layer having properties suitable for high-contrast etching after lithographic exposure, but having limited transparency to visible wavelengths. By way of another example, a VOIT layer may include thick layers of any material on a sample, where the thickness of the material provides a relatively long absorption pathway and/or introduces aberrations that may limit the ability to sensitively probe features located below such layers. Further, a VOIT layer may generally include any layer for which a transmittance is above a selected tolerance for selected SWIR wavelengths (e.g., SWIR wavelengths generated by a SWIR illumination source and detectable with a SWIR detector), but the transmittance is below a selected tolerance for selected visible wavelengths (or other non-SWIR wavelengths). In this way, it is contemplated herein that different applications may have different tolerances that may necessitate the usage of SWIR wavelengths for optical metrology as opposed to non-SWIR wavelengths (e.g., visible, UV, IR, NIR, or the like).

It is recognized herein that characterizing samples including a VOIT layer with SWIR light may enable non-destructive measurements of such samples. For example, characterization of such samples with visible light may require opening one or more windows in the VOIT layer to facilitate the visible measurements of features below the VOIT layer. In contrast, the systems and methods disclosed herein may facilitate direct and non-destructive metrology measurements of features below a VOIT layer. Further, in some embodiments, a VOIT layer includes patterned features (e.g., overlay features, OCD features, or the like) suitable for measurement.

Optical metrology measurements using SWIR illumination may be performed at any suitable location on a sample. For example, optical metrology measurements may be made directly on device features, which may provide a direct measurement of device-relevant characteristics (e.g., overlay, OCD, or the like). By way of another example, optical metrology measurements may be performed on dedicated metrology targets including target features in one or more cells, where metrology measurements based on the dedicated metrology targets are designed to be representative of device features of interest on the sample. These metrology targets may be placed at various locations including within dies or in scribe lines between dies. Dedicated metrology targets may generally be designed for optical metrology measurements using a variety of techniques and may include device-scale features or larger features designed to be resolvable using optical techniques. In a general sense, a metrology target may thus have any suitable size. For instance, typical metrology targets may be in the range of approximately 2-40 micrometers. However, it is to be understood that this is simply an illustration and not limiting. By way of another example, optical metrology measurements may include inspection measurements. For example, SWIR illumination that may penetrate a visibly opaque material (e.g., a VOIT layer) may be useful for reviewing and/or inspecting targets or device structures below the visibly opaque material.

Additionally, metrology targets may include features associated with any step in a fabrication process. For example, a metrology target may include exposure features in a lithographically-exposed photoresist. For instance, exposure features may include areas with a different index of refraction than surrounding material. By way of another example, a metrology target may include patterned features associated with a lithographic exposure and one or more additional steps to develop the features such as, but not limited to, an etch step, a fill step, a polishing step, or a cleaning step. A metrology target may also include different types of features in different sample layers. Any type of optical metrology at any stage of fabrication is thus within the spirit and scope of the present disclosure and may include, but is not limited to, after-etch inspection (AEI) measurements, after-development inspection (ADI) measurements, or after-cleaning inspection (ACI) measurements.

In this way, it is contemplated herein that the systems and methods disclosed herein may be suitable for any type of optical metrology measurement on any type of device segment or fabrication setup such as, but not limited to, memory device fabrication (e.g., dynamic random-access memory (DRAM), 2D or 3D NAND memory, emerging memory, or the like), logic device fabrication, or foundry facilities. For example, massive metrology is described generally in U.S. patent application Ser. No. 17/068,328 filed on Oct. 12, 2020, which is incorporated herein by reference in its entirety. It is contemplated that the systems and methods disclosed herein may expand any of the metrology techniques in U.S. patent application Ser. No. 17/068,328 to utilize SWIR wavelengths. However, it is to be understood that reference to U.S. patent application Ser. No. 17/068,328 is provided merely for illustrative purposes and that the systems and methods disclosed herein may be utilized to expand any metrology technique operating with non-SWIR wavelengths to include at least some SWIR wavelengths.

Various operational modes of a SWIR optical metrology tool of a sample or metrology target on a sample are within the spirit and scope of the present disclosure. For example, a single SWIR detector may be utilized to generate an optical metrology measurement based on a measurement of various layers or features on a sample. Further, as is described throughout the present disclosure, a SWIR detector may be sensitive to non-SWIR wavelengths as well as SWIR wavelengths such that a SWIR detector may be used for various measurements at multiple illumination wavelengths. By way of another example, a SWIR detector may be used to generate a first dataset associated with one or more sample layers or features (e.g., features below a VOIT layer) and an additional detector of any type may be used to generate a second dataset associated with additional sample layers or features (e.g., features on or above a VOIT layer). These two datasets may be stitched or otherwise combined to form the basis of a single measurement (e.g., an overlay measurement, or the like). Alternatively, the two datasets may each be the basis of separate measurements. In this way, the SWIR optical metrology too may operate as two tools operating in parallel.

Some embodiments of the present disclosure are directed to overlay metrology utilizing at least some SWIR wavelengths. The term overlay is used herein to describe relative positions of features on a sample fabricated by or otherwise associated with two or more lithographic exposures, where the term overlay error describes a deviation of the features from a nominal arrangement. For instance, overlay metrology may be associated with the relative alignment of fields in a lithographic exposure device such as, but not limited to, a scanner or a stepper operating at any selected wavelength or wavelength range (e.g., extreme ultraviolet, deep ultraviolet, or the like).

As an example, a multi-layered device may include features patterned on multiple sample layers using different lithography exposures for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Overlay metrology utilizing at least some SWIR wavelengths may performed on overlay metrology targets with any design suitable for any measurement technique. For example, an overlay target may include periodic and/or non-periodic features. By way of another example, an overlay metrology target may include features arranged to provide one-dimensional measurements (e.g., measurements along a single measurement direction) or two-dimensional measurements (e.g., measurements along two measurement directions). In some embodiments, an overlay metrology target includes features in non-overlapping areas (e.g., working zones) such as, but not limited to, a box-in-box (BiB) target, a bar next to bar (BnB) target, an advanced imaging metrology (AIM) target, a triple AIM (TAIM) target, or an AIM in-die (AIMid) target. Such targets may be suitable for, but are not limited to, imaging-based techniques in which features associated with different lithographic exposures on one or more layers of interest may be separately visible. In some embodiments, an overlay metrology target includes features in overlapping areas. For example, an overlay metrology target may include grating-over-grating features including gratings or other periodic structures associated with two or more lithographic exposures in overlapping areas on one or more sample layers. By way of another example, an overlay metrology target may include a robust AIM (rAIM) target including features designed to generate Moiré fringes. Overlay metrology targets and associated measurement techniques are generally described in U.S. Pat. No. 7,879,627 issued on Feb. 1, 2011, U.S. Pat. No. 10,527,951 issued on Jan. 7, 2020, U.S. Patent Publication No. 2021/0072650 published on Mar. 11, 2021, U.S. Patent Publication No. 2020/0409271 published on Dec. 31, 2020, all of which are incorporated herein by reference in its entirety.

Some embodiments of the present disclosure are directed to OCD metrology using at least some SWIR wavelengths. For example, OCD metrology using SWIR illumination may facilitate non-destructive measurements of features below a VOIT layer without requiring the formation of a window in the VOIT layer. Further, OCD metrology using SWIR illumination may be implemented using any technique known in the art such as, but not limited to, bright-field or dark-field imaging metrology.

It is contemplated herein that optical metrology may be performed using at least some SWIR wavelengths in a variety of ways. In one embodiment, a first metrology measurement is generated using a first wavelength in the SWIR spectral range and a second metrology measurement is generated using an additional wavelength, which may be in the SWIR or visible spectral ranges. In this way, a final metrology measurement may be generated that is based on the first and second metrology measurements. In another embodiment, a single metrology measurement is generated by using different wavelengths to generate different measurement signals for different sample layers. Metrology with layer-specific illumination spectra is generally described in U.S. Pat. No. 10,444,161 issued on Oct. 15, 2019, which is incorporated by reference in its entirety. It is contemplated that the systems and methods disclosed herein may provide layer-specific metrology utilizing at least some SWIR wavelengths. For example, a first measurement signal (e.g., a first image, or the like) of a first layer of the sample may be generated using a first wavelength in the SWIR spectral range and a second measurement signal of a second layer of the sample may be generated using a second wavelength, which may be in the SWIR or visible spectral ranges.

Additional embodiments are directed to SWIR metrology targets that may benefit from or in some cases require characterization with SWIR wavelengths. In some embodiments, a SWIR metrology target includes one or more VOIT layers. For example, a SWIR metrology target may include target features located on one or more layers of interest below one or more VOIT layers. In this way, SWIR wavelengths may be used to penetrate the one or more VOIT layers to characterize the target features. In one embodiment, all target features on layers of interest are located below at least one VOIT layer. In another embodiment, a SWIR metrology target includes one or more first-layer features on a first layer of a sample located below a VOIT layer and one or more second-layer features located on or above the VOIT layer.

A SWIR metrology target may include features having any selected layout suitable for any selected overlay metrology technique, where at least one sample layer is a VOIT layer. As an illustrative example in the context of overlay metrology, a SWIR overlay metrology target may include variations of any overlay target known in the art such as, but not limited to, a BiB target, a BnB target, an AIM target, an AIMid target, a rAIM target, a TAIM target, or a grating-over-grating target, where at least one sample layer of interest is on or below a VOIT layer.

In one embodiment, a SWIR overlay metrology target suitable for image-based overlay metrology includes features on one or more sample layers in non-overlapping areas, where target features on at least one sample layer are located below a VOIT layer. In this way, the target features on each layer of interest may be imaged. Overlay may then be determined using any technique known in the art. For instance, overlay may be determined based on relative positions of the features on the sample layers of interest (e.g., relative positions of centers of symmetry of the features of interest). In another embodiment, a SWIR overlay target suitable for scatterometry overlay includes features on one or more sample layers in overlapping areas to form grating-over-grating structures, where target features on at least one sample layer are located below a VOIT layer. In this way, an overlay measurement may be generated by illuminating a SWIR overlay target and capturing an angular distribution of light emanating from the sample associated with diffraction, scattering, and/or reflection of the illumination beam by the grating-over-grating structure.

Additional embodiments of the present disclosure are directed to characterizing SWIR metrology targets using at least some SWIR wavelengths. For example, SWIR illumination may be used to characterize one or more sample layers below a VOIT layer. Further, any combination of SWIR or visible illumination may be used to characterize the VOIT layer or any additional layers above the VOIT layer.

Referring now to FIGS. 1A-3, systems and methods for optical metrology using SWIR wavelengths are disclosed in accordance with one or more embodiments of the present disclosure.

FIG. 1A is a conceptual block-diagram view of a SWIR optical metrology system 100 utilizing illumination with at least one wavelength in a SWIR spectral range, in accordance with one or more embodiments of the present disclosure.

In one embodiment, the SWIR optical metrology system 100 includes a SWIR optical metrology tool 102 for providing an optical metrology measurement of a SWIR metrology target 104 on a sample 106. The SWIR optical metrology tool 102 may include at least one illumination source 108 to generate illumination 110 in a SWIR spectral range and at least one measurement channel 112 including a detector 114 sensitive to the SWIR illumination 110 provided by the illumination source 108. Further, the SWIR optical metrology tool 102 may include, but is not required to include, at least one illumination source 108 to generate illumination 110 in a visible spectral range and at least one measurement channel 112 including a detector 114 sensitive to the visible illumination 110. In this way, the SWIR optical metrology tool 102 may be a multi-channel optical metrology tool. For example, FIG. 1A illustrates a SWIR optical metrology tool 102 having N measurement channels 112-1 through 112-N. In another embodiment, the SWIR optical metrology system 100 includes a translation stage 116 suitable for securing the sample 106 and further configured to position the sample 106 with respect to the SWIR optical metrology tool 102.

The SWIR optical metrology tool 102 may include any illumination source 108 known in the art suitable for generating illumination 110 in at least the SWIR spectral range. Further, in configurations in which visible wavelengths are generated, the SWIR optical metrology tool 102 may include a single illumination source 108 to generate all wavelengths of interest or multiple illumination sources 108 to generate illumination 110 in multiple spectral bands. Further, the illumination 110 in any spectral band may have any selected bandwidth. For example, an illumination source 108 may generate narrowband illumination 110 or broadband illumination 110. The SWIR optical metrology tool 102 may include also spectral filters to further tailor the spectral properties of the illumination 110 from any of one or more illumination sources 108.

The illumination source 108 may generate illumination 110 having any degree of spatial and/or temporal coherence. Further, in cases where low coherence is required (e.g., imaging applications in which speckle is undesirable), the illumination source 108 may generate directly generate low-coherence illumination 110 or the SWIR optical metrology system 100 may generate higher-coherence illumination 110 and include one or more elements to reduce the coherence (e.g., a speckle-reducer).

The illumination source 108 may further provide light having any selected temporal characteristics. In one embodiment, the illumination source 108 includes one or more continuous-wave sources to provide a continuous-wave illumination 110. In another embodiment, the illumination source 108 includes one or more pulsed sources to provide a pulsed or otherwise modulated illumination 110. For example, the illumination source 108 may include one or more mode-locked lasers, one or more Q-switched lasers, or the like.

In one embodiment, the illumination source 108 includes a laser source. For example, an illumination source 108 may include, but is not limited to, one or more narrowband laser sources, a broadband laser source, a supercontinuum laser source, a white light laser source, or the like. In another embodiment, an illumination source 108 includes a laser-sustained plasma (LSP) source. For example, an illumination source 108 may include, but is not limited to, a LSP lamp, a LSP bulb, or a LSP chamber suitable for containing one or more elements that, when excited by a laser source into a plasma state, may emit broadband illumination. In another embodiment, an illumination source 108 includes a lamp source. For example, an illumination source 108 may include, but is not limited to, an arc lamp, a discharge lamp, an electrode-less lamp, or the like. In another embodiment, the illumination source 108 includes a light-emitting diode (LED).

An illumination source 108 may provide illumination 110 (e.g., illumination 110 with SWIR wavelengths, visible wavelengths, or a combination thereof) using free-space techniques and/or optical fibers. Further, the SWIR optical metrology tool 102 may generate the illumination 110 in the form of one or more illumination beams or illumination lobes having limited angular extent, which may be suitable for, but is not limited to, scatterometry or diffraction-based optical metrology techniques in which discrete diffraction orders are captured and analyzed to generate an optical metrology measurement. In one embodiment, the SWIR optical metrology tool 102 may include one or more apertures and/or polarization-controlling elements at an illumination pupil plane to divide illumination from an illumination source 108 into separate illumination beams. In another embodiment, the SWIR optical metrology tool 102 generates multi-beam illumination 110 by providing light in two or more optical fibers, where illumination 110 in the optical fibers may be separately directed to the sample 106 as separate illumination beams. In another embodiment, the SWIR optical metrology tool 102 generates multi-lobe illumination 110 by diffracting illumination 110 from an illumination source 108 into two or more diffraction orders, where the diffraction orders may be separately directed to the sample 106 as separate illumination beams. Efficient generation of multiple illumination lobes through controlled diffraction is generally described in U.S. Patent Publication No. US2020/0124408 published on Apr. 23, 2020, which is incorporated herein by reference in its entirety.

The SWIR optical metrology tool 102 may further include any number of detectors 114, where at least one of the detectors 114 is a SWIR detector sensitive to at least some SWIR wavelengths. In one embodiment, the SWIR optical metrology tool 102 includes an InGaAs detector. In another embodiment, the SWIR optical metrology tool 102 includes an HgCdTe detector. In another embodiment, the SWIR optical metrology tool 102 includes one or more detectors sensitive to visible wavelengths of light including, but not limited to, a silicon detector, a black silicon detector, a GaAs detector, or a quantum-dot sensor.

A measurement channel 112 of the SWIR optical metrology tool 102 may include any number, type, or arrangement of detectors 114 suitable for capturing light from the sample 106. In one embodiment, a measurement channel 112 includes one or more detectors 114 suitable for characterizing a static sample. In this regard, the measurement channel 112 may operate in a static mode in which the sample 106 is static during a measurement. For example, a detector 114 may include a two-dimensional pixel array (e.g., a focal plane array (FPA)) such as, but not limited to, a charge-coupled device (CCD) or a complementary metal-oxide-semiconductor (CMOS) device. In another embodiment, a measurement channel 112 includes one or more detectors 114 suitable for characterizing a moving sample (e.g., a sample scanned by the translation stage 116). In this regard, the measurement channel 112 may operate in a scanning mode in which the sample 106 is scanned with respect to a measurement field during a measurement. For example, the detector 114 may include a 2D pixel array with a capture time and/or a refresh rate sufficient to capture one or more images during a scan within selected image tolerances (e.g., image blur, contrast, sharpness, or the like). By way of another example, the detector 114 may include a line-scan detector to continuously generate an image one line of pixels at a time. By way of another example, the detector 114 may include a time-delay integration (TDI) detector.

In another embodiment, a detector 114 with a pixel array (e.g., a 1D or a 2D pixel array) may be configured such that various subsets of pixels are used for different measurements. For example, different subsets of pixels of a detector 114 may provide measurements associated with different illumination and/or collection conditions such as, but not limited to, polarization or wavelengths. Further, the different measurements provided by the subsets of pixels may be associated with a common measurement channel 112 or different measurement channels 112.

A measurement channel 112 may further include one or more detectors 114 at any desired location suitable for capturing light from the sample 106 suitable for generating an optical metrology measurement. In one embodiment, a measurement channel 112 includes a detector 114 at a field plane (e.g., a plane conjugate to the sample 106) to generate an image of target features on the sample 106. In another embodiment, a measurement channel 112 includes a detector 114 at a pupil plane (e.g., a diffraction plane) to capture an angular distribution of light from the sample 106 or light emanating from the sample 106 at selected angles. For instance, diffraction orders associated with diffraction of the illumination 110 from the sample 106 (e.g., a SWIR metrology target 104 target on the sample 106) may be imaged or otherwise observed in the pupil plane. In a general sense, a detector 114 may capture any combination of reflected (or transmitted), scattered, or diffracted light from the sample 106.

In a general sense, a measurement channel 112 may include components configured to provide any type of optical metrology measurement. Additionally, various measurement channels 112 in a multi-channel SWIR optical metrology tool 102 may be configured to provide the same or different types of measurements. For example, a SWIR optical metrology tool 102 may include one or more measurement channels 112 to generate bright-field images at one or more wavelengths (e.g., SWIR wavelengths, visible wavelengths, or the like) and one or more measurement channels 112 to generate dark-field images and one or more wavelengths. By way of another example, a SWIR optical metrology tool 102 may include one or more measurement channels 112 to generate one or more field-plane images of a sample 106 and one or more measurement channels 112 to generate one or more pupil-plane images of the sample 106. In this way, the SWIR optical metrology tool 102 may perform any combination of optical metrology measurements and/or may provide optical metrology data based on any optical metrology measurement technique known in the art, where at least one measurement channel 112 utilizes light in a SWIR spectral range.

In another embodiment, the SWIR optical metrology system 100 includes a controller 118. The controller 118 may include one or more processors 120 configured to execute program instructions maintained on memory medium 122, or memory. In this regard, the one or more processors 120 of controller 118 may execute any of the various process steps described throughout the present disclosure. Further, the controller 118 may be communicatively coupled to the SWIR optical metrology tool 102 or any component therein.

The one or more processors 120 of a controller 118 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 120 may include any device configured to execute algorithms and/or instructions (e.g., program instructions stored in memory). In one embodiment, the one or more processors 120 may be embodied as a desktop computer, mainframe computer system, workstation, image computer, parallel processor, networked computer, or any other computer system configured to execute a program configured to operate or operate in conjunction with the SWIR optical metrology system 100, as described throughout the present disclosure Moreover, different subsystems of the SWIR optical metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 118 or, alternatively, multiple controllers. Additionally, the controller 118 may include one or more controllers housed in a common housing or within multiple housings. In this way, any controller or combination of controllers may be separately packaged as a module suitable for integration into the SWIR optical metrology system 100.

The memory medium 122 may include any storage medium known in the art suitable for storing program instructions executable by the associated one or more processors 132. For example, the memory medium 122 may include a non-transitory memory medium. By way of another example, the memory medium 122 may include, but is not limited to, a read-only memory (ROM), a random-access memory (RAM), a magnetic or optical memory device (e.g., disk), a magnetic tape, a solid-state drive and the like. It is further noted that memory medium 122 may be housed in a common controller housing with the one or more processors 120. In one embodiment, the memory medium 122 may be located remotely with respect to the physical location of the one or more processors 120 and controller 118. For instance, the one or more processors 120 of controller 118 may access a remote memory (e.g., server), accessible through a network (e.g., internet, intranet and the like).

Referring now to FIGS. 2A-2E, SWIR targets 104 suitable for characterization with a SWIR optical metrology system 100 are described in greater detail in accordance with one or more embodiments of the present disclosure.

As described previously herein, a SWIR metrology target 104 may be formed as a dedicated metrology target or may correspond to a portion of a sample 106 including device features arranged in a way suitable for direct optical metrology measurements. In configurations in which a SWIR metrology target 104 is a dedicated metrology target, the SWIR metrology target 104 may include target features having any size, distribution, density, or orientation suitable for metrology measurements. For example, the SWIR metrology target 104 may include device-like or device-scale features suitable for metrology measurements.

The target features on any layer of a SWIR metrology target 104 may further be associated with any fabrication or processing stage. For example, target features on one or more layers may be patterned elements associated with lithographic exposure and one or more additional processing steps such as, but not limited to, etching or cleaning. In this way, the patterned features may correspond to three-dimensional patterned structures of a selected material (e.g., process layers). By way of another example, target features on one or more layers may be exposure features associated with patterns in a resist layer induced by lithographic exposure prior to additional processing steps. In this way, the exposure features may be associated with patterns of different optical and/or chemical properties in the resist layer induced by the lithographic exposure. Thus, in a general sense, a SWIR metrology target 104 may be suitable for optical metrology at any fabrication stage such as, but not limited to, after development inspection (ADI), after-etch inspection (AEI), or after-cleaning inspection (ACI).

In one embodiment, a SWIR metrology target 104 includes at least one VOIT layer 202 and one or more target features on one or more layers on or below the VOIT layer 202. A VOIT layer 202 may include any layer having limited transparency to visible wavelengths and having suitable transparency to SWIR wavelengths. It is recognized herein that materials may generally have complex absorption and transmission spectra and that transitions between opaque and transmissive regions may have varying sharpness. Accordingly, it is to be understood that in the context of the present disclosure, a VOIT layer 202 has a transmissivity at selected visible wavelengths that is below a selected visible-wavelength tolerance and a transmissivity at selected SWIR wavelengths that is above a selected SWIR-wavelength tolerance. For example, the visible-wavelength tolerance and/or the SWIR-wavelength tolerance may be selected based on factors such as, but not limited to, the spectral intensity of an illumination source 108 at certain wavelengths of interest, the quantum efficiencies of available detectors 114 at certain wavelengths of interest, signal to noise thresholds for a given application, or measurement sensitivity targets for a given application. As an illustration in the case of after-etch inspection in which a SWIR metrology target 104 target includes one or more patterned features in a first layer (e.g., a process layer) and one or more exposure features in a resist layer located above the process layer, it may be desirable to utilize a hard photomask that provides highly selective etching properties but has limited or no transparency to visible wavelengths associated with a typical optical inspection system. This hard photomask may then be characterized as a VOIT layer 202, particularly when the transmissivity to the visible associated with a typical optical inspection system is sufficiently low as to degrade the sensitivity or accuracy of optical metrology measurements.

In a general sense, the systems and methods disclosed herein may be used to extend any design of a metrology target to include at least one VOIT layer 202 such as, but not limited to, overlay metrology targets or OCD metrology targets. Additionally, although FIGS. 2A-2E illustrate two-layer SWIR targets 104 suitable for characterizing overlay of two sample layers of interest, it is to be understood that a SWIR metrology target 104 may have target features on any number of sample layers and may thus be suitable for characterizing overlay of any number of layers of interest.

Figure 2A:
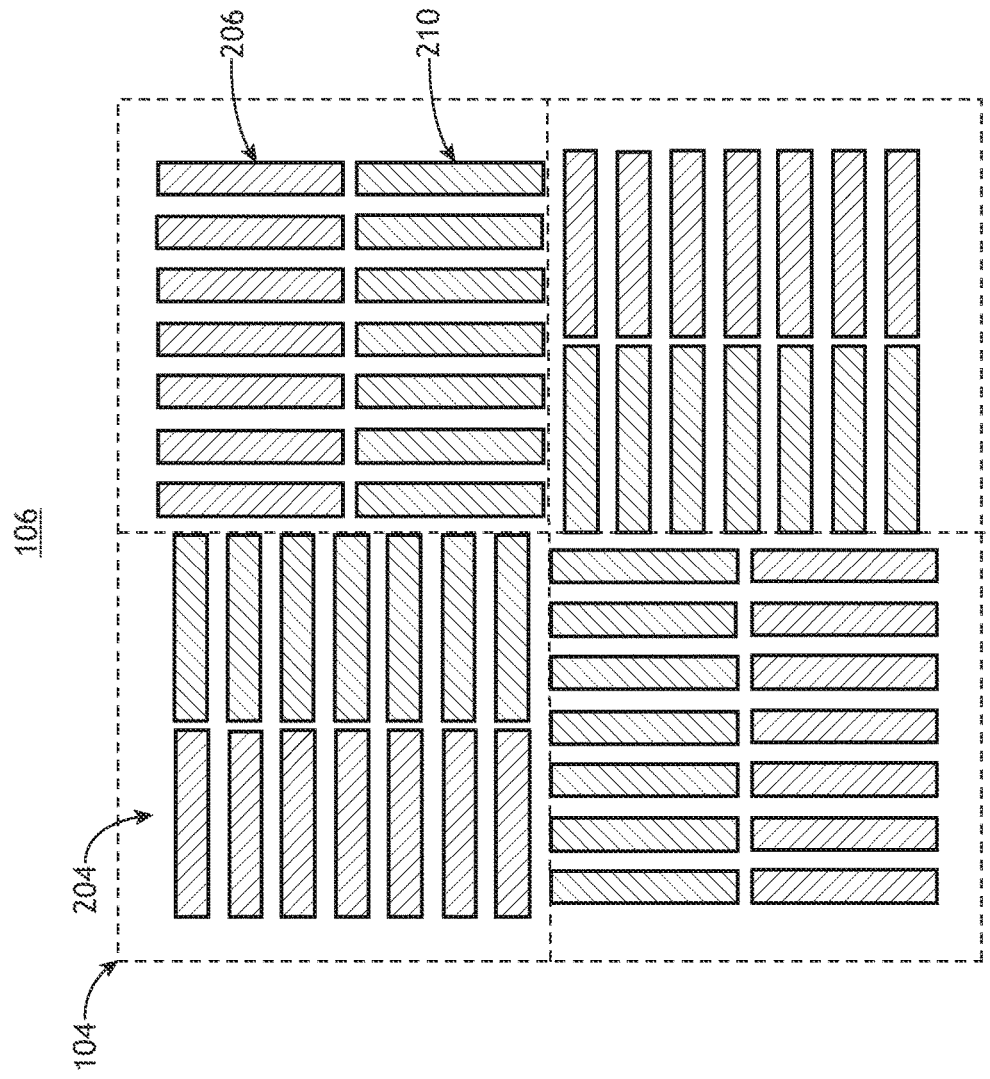
FIG. 2A is a top view of a SWIR metrology target including non-overlapping target features in a process layer and a resist visibly-opaque IR-transparent (VOIT) layer, in accordance with one or more embodiments of the present disclosure.
Figure 2B:
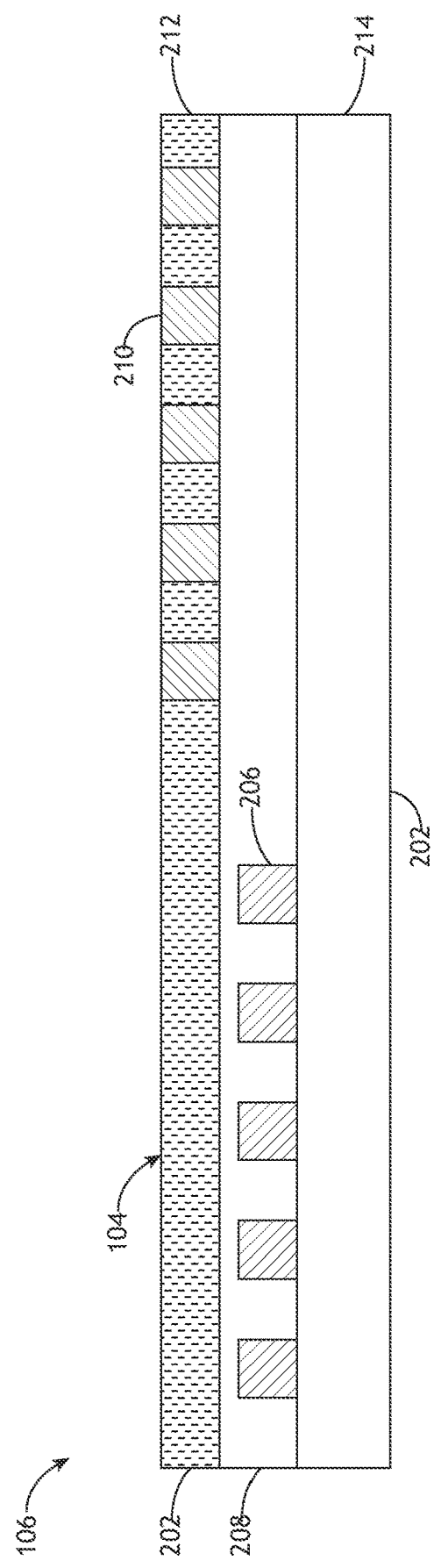
FIG. 2B is a side view of one cell of the SWIR metrology target of FIG. 2A in accordance with one or more embodiments of the present disclosure.

FIG. 2A is a top view of a SWIR metrology target 104 including non-overlapping target features in a process layer and a resist VOIT layer 202, in accordance with one or more embodiments of the present disclosure. FIG. 2B is a side view of one cell 204 of the SWIR metrology target 104 of FIG. 2A in accordance with one or more embodiments of the present disclosure. Such a target may be suitable for, but is not limited to, overlay metrology.

In one embodiment, the SWIR metrology target 104 includes first-exposure features 206 on a first layer 208 of the sample 106 and second-exposure features 210 a second layer 212 of the sample 106 formed as a resist layer that is at least partially opaque to visible wavelengths. In this way, the second layer 212 corresponds to a VOIT layer 202. FIGS. 2A and 2B additionally illustrate a substrate 214 on which the first layer 208 and the second layer 212 are deposited. Further, first-exposure features 206 and the second-exposure features 210 may not overlap such that they can be separately characterized (e.g., imaged). Such as structure may thus be suitable for, but is not limited to, image-based overlay techniques. It is noted that portions of the resist VOIT layer 202 not associated with the second-exposure features 210 are omitted from the top view of FIG. 2A as it would obscure the first-exposure features 206.

However, since the second layer 212 is a VOIT layer 202, the first-exposure features 206 may not be visible through or at least have limited visibility through the VOIT layer 202. In this way, overlay metrology based solely on visible wavelengths may be infeasible or may provide sensitivity lower than a threshold required for a particular application. However, the first-exposure features 206 may be readily characterized with illumination 110 having SWIR wavelengths that propagate through the VOIT layer 202 with minimal or at least acceptable loss. Further, as will be described in greater detail below, the second layer 212 may be characterized with any selected wavelengths including visible wavelengths or SWIR wavelengths.

The first-exposure features 206 and the second-exposure features 210 may have any size, distribution, density, or orientation suitable for overlay measurements. For example, as illustrated in FIGS. 2A and 2B, the first-exposure features 206 and/or the second-exposure features 210 may be periodically distributed along a selected direction (e.g., a measurement direction). In this way, the first-exposure features 206 and/or the second-exposure features 210 may generate discrete diffraction orders such that an overlay measurement may be based on selected diffraction orders. Further, the first-exposure features 206 and the second-exposure features 210 may have, but are not required to have, a common period such that diffraction orders from the first-exposure features 206 and the second-exposure features 210 are collocated in the collection pupil. Although not shown, any of the first-exposure features 206 or the second-exposure features 210 may also be further segmented (e.g., with sub-wavelength assist features (SWAF)).

Additionally, as illustrated in FIGS. 2A and 2B, the SWIR metrology target 104 may include multiple cells 204, where different cells 204 include features oriented along different directions to facilitate measurements along the different directions. It is contemplated herein that the distribution of target features (e.g., the first-exposure features 206 and the second-exposure features 210) in various cells 204 may vary based on the overlay algorithm used to determine overlay error associated with two or more layers of the sample 106. For example, the SWIR metrology target 104 illustrated in FIG. 2A corresponds to a variation of an advanced imaging overlay (AIM) overlay target in which the target features associated with a particular measurement direction on each layer of the sample are located in a rotationally symmetric pattern of cells (e.g., symmetric about a 90° rotation, a 180° rotation, or rotation about any selected angle). However, it is to be understood that the use of an AIM overlay target is provided solely for illustrative purposes and should not be interpreted as limiting. Rather, a SWIR metrology target 104 having any layout of features on one or more sample layers is within the spirit and scope of the present disclosure.

Figure 2C:
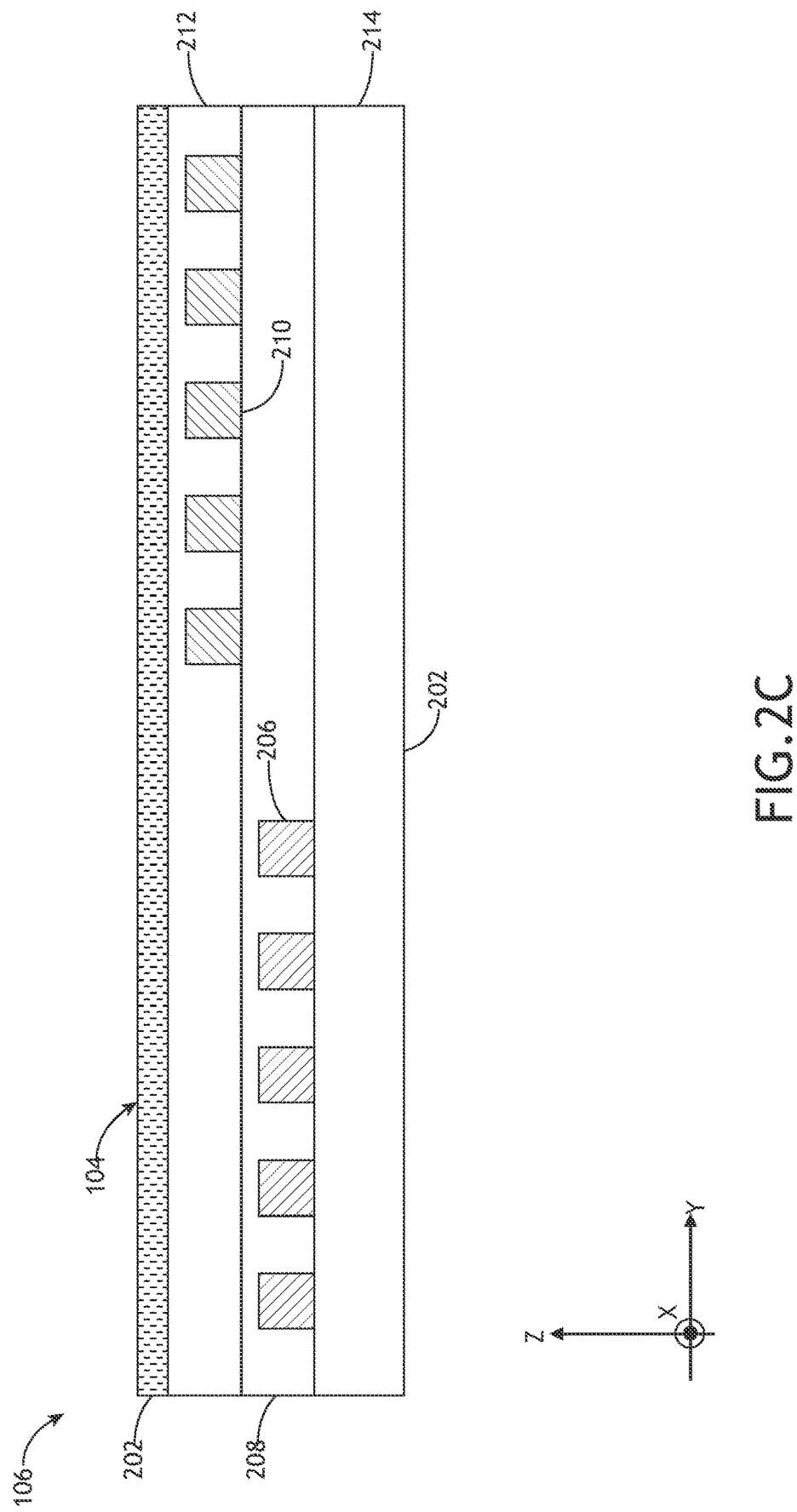
FIG. 2C is a side view of a SWIR metrology target including non-overlapping features in two process layers covered by a VOIT layer in accordance with one or more embodiments of the present disclosure.

FIG. 2C is a side view of a SWIR metrology target 104 including non-overlapping features in two process layers covered by a VOIT layer 202 in accordance with one or more embodiments of the present disclosure. The SWIR metrology target 104 in FIG. 2C may be similar to the SWIR metrology target 104 in FIGS. 2A and 2B except that the first-exposure features 206 and the second-exposure features 210 are each formed as fully-fabricated patterned elements in process layers. Further, both the first layer 208 and the second layer 212 are covered by a VOIT layer 202 (e.g., a cap layer). Accordingly, both the first-exposure features 206 and the second-exposure features 210 may be characterized by illumination 110 having SWIR wavelengths that propagate through the VOIT layer 202 with minimal or at least acceptable loss.

Figure 2D:
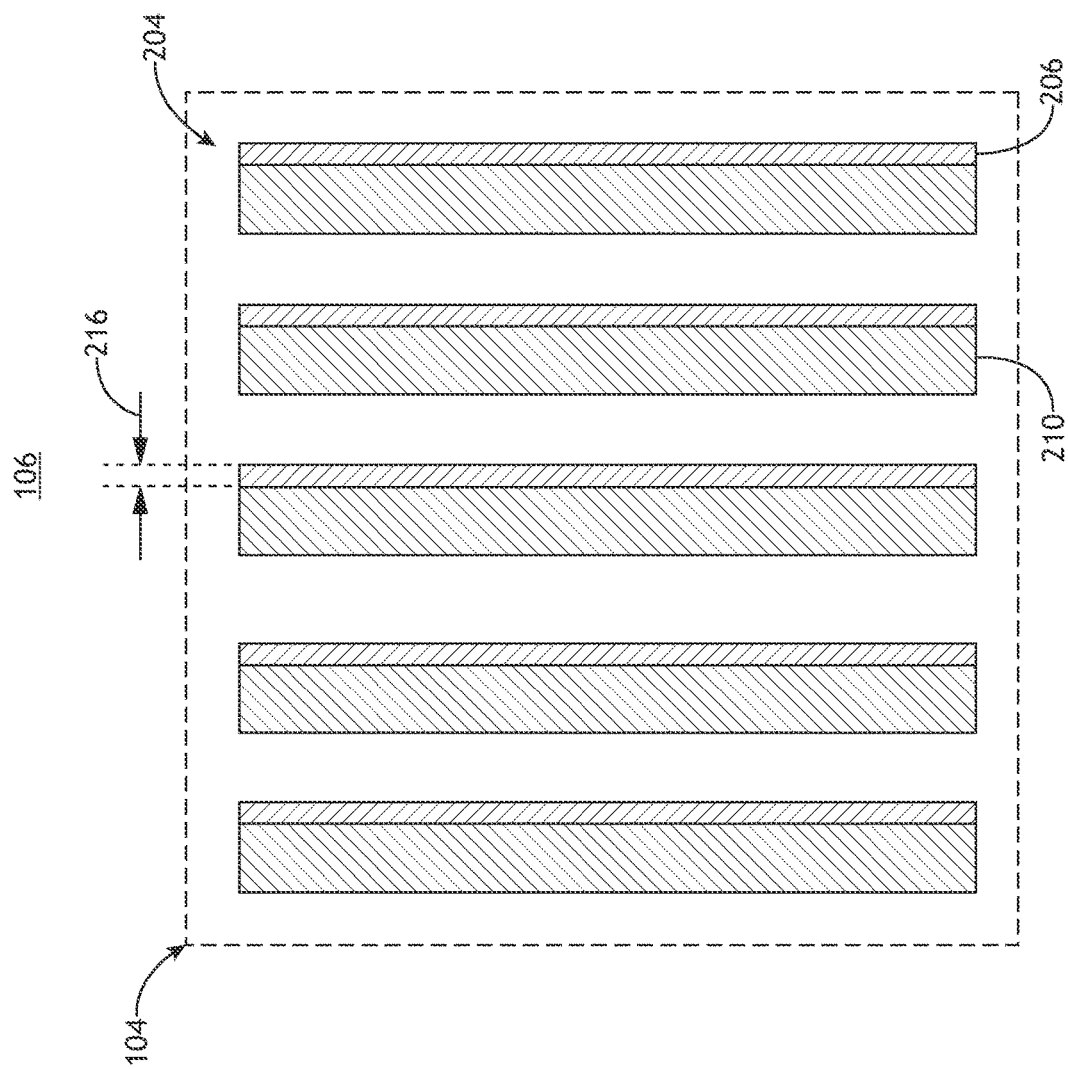
FIG. 2D is a top view of a SWIR metrology target including overlapping target features in a process layer and a resist VOIT layer, in accordance with one or more embodiments of the present disclosure.
Figure 2E:
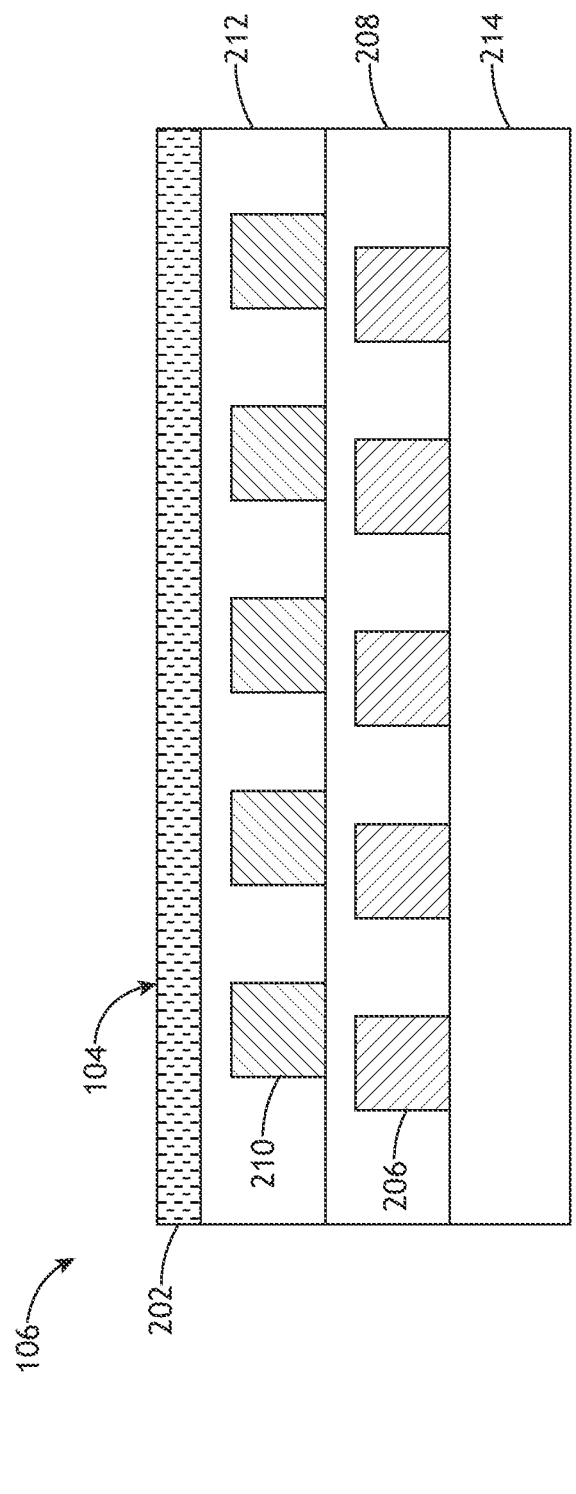
FIG. 2E is a side view of the SWIR metrology target of FIG. 2D in accordance with one or more embodiments of the present disclosure.

FIG. 2D is a top view of a SWIR metrology target 104 including overlapping target features in a process layer and a resist VOIT layer 202, in accordance with one or more embodiments of the present disclosure. FIG. 2E is a side view of the SWIR metrology target 104 of FIG. 2D in accordance with one or more embodiments of the present disclosure.

As illustrated in FIGS. 2D and 2E, in one embodiment, a SWIR metrology target 104 includes first-exposure features 206 on a first layer 208 and second-exposure features 210 on a second layer 212, where the first-exposure features 206 and the second-exposure features 210 are fabricated in overlapping regions of the sample 106 to form a grating-over-grating structure. Further, the first-exposure features 206 and the second-exposure features 210 may be offset with an offset distance 216, which may be associated with an intended offset, an overlay error, or a combination thereof. Additionally, though not shown, a SWIR metrology target 104 with overlapping target features may have multiple cells 204, where the different cells 204 include features with different directions of periodicity (e.g., for measuring overlay along different directions) and/or different intended offset distances 216 to facilitate sensitive metrology.

In another embodiment, as illustrated in FIG. 2E, the SWIR metrology target 104 includes a VOIT layer 202 covering the first-exposure features 206 and the second-exposure features 210. It is noted that the VOIT layer 202 is omitted from FIG. 2D for clarity to facilitate illustration of the first-exposure features 206 and the second-exposure features 210. In this way, the first-exposure features 206 and the second-exposure features 210 may not be visible through or at least have limited visibility through the VOIT layer 202 such that overlay metrology based solely on visible wavelengths may be infeasible or may provide sensitivity lower than a threshold required for a particular application. However, the first-exposure features 206 and the second-exposure features 210 may be readily characterized with illumination 110 having SWIR wavelengths that propagate through the VOIT layer 202 with minimal or at least acceptable loss.

It is to be understood, however, that the SWIR targets 104 illustrated in FIGS. 2A-2E are provided solely for illustrative purposes and should not be interpreted as limiting. For example, although the SWIR targets 104 in FIGS. 2A-2E illustrate two-layer targets suitable for characterizing overlay errors between lithographic exposures on two sample layers, a SWIR metrology target 104 may be suitable for characterizing overlay errors between any number of lithographic exposures on one or more sample layers in overlapping or non-overlapping configurations.

Further, it is to be understood that the illustration of the SWIR targets 104 illustrated in FIGS. 2A-2E suitable for overlay metrology is also provided solely for illustrative purposes and should not be interpreted as limiting. For example, OCD metrology may be performed on features present on any of the layers of the SWIR metrology target 104. Further, although not shown, a SWIR metrology target 104 for dedicated OCD metrology may include features on one or more sample layers below a VOIT layer 202. For instance, a SWIR metrology target 104 for dedicated OCD metrology may be similar to the SWIR metrology target 104 illustrated in FIG. 2E (or a portion thereof), but including features on only a single layer below the VOIT layer 202.

Referring now to FIGS. 1B-1F, various aspects and configurations of the SWIR optical metrology tool 102 are described in greater detail in accordance with one or more embodiments of the present disclosure. The SWIR optical metrology tool 102 may be suitable for generating optical metrology measurements using any SWIR metrology target 104 having dimensions suitable for wavelengths of illumination 110 provided by the SWIR optical metrology tool 102. For example, the SWIR optical metrology tool 102 may generate optical metrology measurements based on SWIR targets 104 with a VOIT layer 202 such as, but not limited to, those illustrated in FIGS. 2A-2E. By way of another example, the SWIR optical metrology tool 102 may generate optical metrology measurements based on SWIR targets 104 without a VOIT layer 202.

In some embodiments, a SWIR optical metrology tool 102 may be provided as an upgrade to a single or multi-channel optical metrology tool using detectors that are sensitive to visible wavelengths. For example, the SWIR optical metrology tool 102 may be provided by adding an illumination source 108 suitable for providing SWIR illumination 110 (or utilizing SWIR illumination 110 provided by an existing broadband illumination source 108) and switching one or more visible-wavelength detectors 114 in one or more measurement channels 112 to SWIR detectors 114. Further, various additional components throughout the SWIR optical metrology tool 102 within the path of the SWIR illumination 110 and/or the associated collected light 132 may also be switched, replaced, or upgraded to be compatible with the SWIR wavelengths. For example, a two-channel optical metrology tool including visible-wavelength detectors 114 may be upgraded to a SWIR optical metrology tool 102 by switching or replacing one or both of the visible-wavelength detectors 114 with SWIR detectors 114. By way of another example, a two-channel optical metrology tool including visible-wavelength detectors 114 may be upgraded to a SWIR optical metrology tool 102 by adding an additional measurement channel 112 with a SWIR detector 114. It is to be understood, however, that the above examples are provided solely for illustrative purposes and should not be interpreted as limiting. Rather, a SWIR optical metrology tool 102 may include any number of channels with at least one SWIR detector 114. Further, a SWIR optical metrology tool 102 need not be an upgraded version of a visible-wavelength optical metrology tool.

Figure 1B:
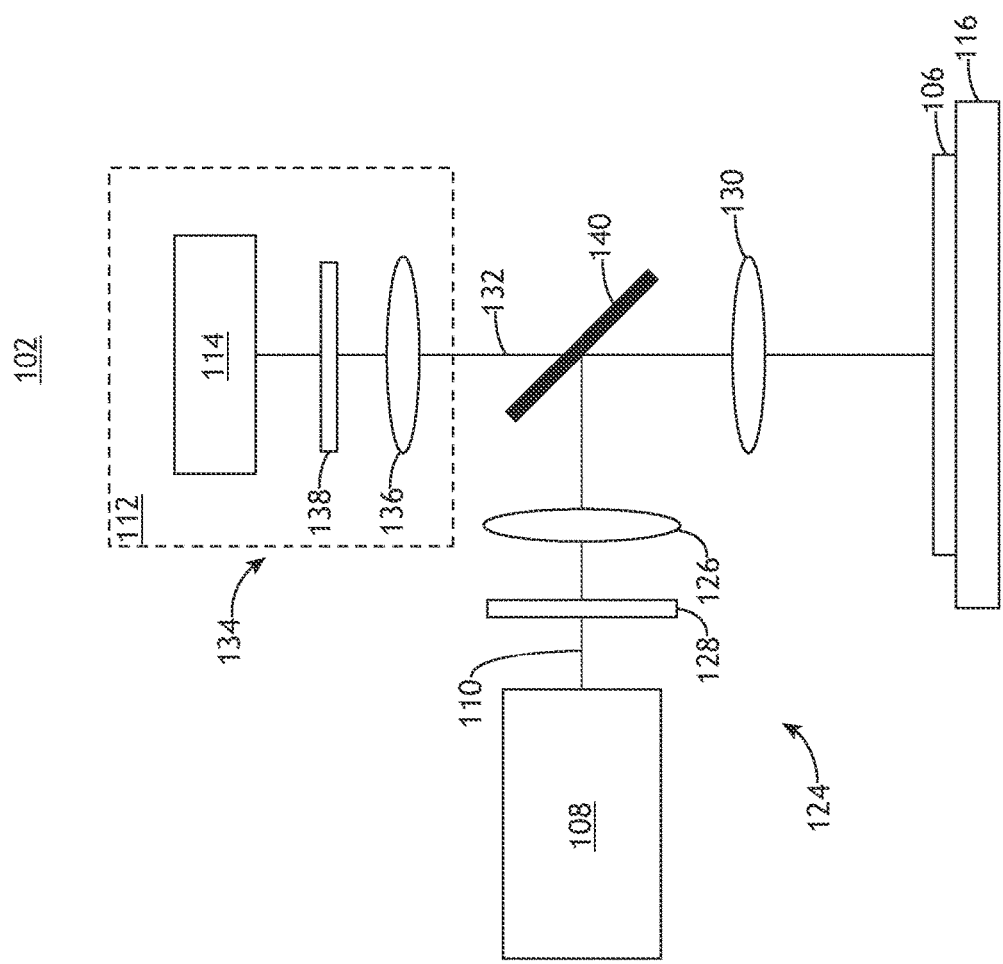
FIG. 1B is a conceptual view of a SWIR optical metrology tool including a single measurement channel in accordance with one or more embodiments of the present disclosure.

FIG. 1B is a conceptual view of a SWIR optical metrology tool 102 including a single measurement channel 112 in accordance with one or more embodiments of the present disclosure.

In one embodiment, the SWIR optical metrology tool 102 includes an illumination source 108 to generate illumination 110 having one or more wavelengths in the SWIR spectral range. Further, the SWIR optical metrology tool 102 may direct the illumination 110 from the illumination source 108 to the sample 106 via an illumination pathway 124. The illumination pathway 124 may include one or more optical components suitable for modifying and/or conditioning the illumination 110 as well as directing the illumination 110 to the sample 106. For example, the illumination pathway 124 may include one or more illumination-pathway lenses 126 (e.g., to collimate the illumination 110, to relay pupil and/or field planes, or the like). By way of another example, the illumination pathway 124 includes one or more illumination-pathway optics 128 to shape or otherwise control the illumination 110. For example, the illumination-pathway optics 128 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In another embodiment, the SWIR optical metrology tool 102 includes an objective lens 130 to collect light from the sample 106 (e.g., collected light 132). In another embodiment, the SWIR optical metrology tool 102 includes a collection pathway 134 to direct the collected light 132 to one or more detectors 114 in one or more measurement channels 112. As described previously herein, a measurement channel 112 may include one or more detectors 114 at any location. For example, a measurement channel 112 may include a detector 114 at a field plane to image or otherwise characterize features of a SWIR metrology target 104. By way of another example, a measurement channel 112 may include a detector 114 at a pupil plane. In this way, the detector 114 may generate a pupil image associated with an angular distribution of the collected light 132, which may be useful for, but is not limited to, scatterometry or diffraction-based techniques.

The collection pathway 134 may include one or more optical elements suitable for modifying and/or conditioning the collected light 132 from the sample 106. In one embodiment, the collection pathway 134 includes one or more collection-pathway lenses 136 (e.g., to collimate the illumination 110, to relay pupil and/or field planes, or the like), which may include, but is not required to include, the objective lens 130. In another embodiment, the collection pathway 134 includes one or more collection-pathway optics 138 to shape or otherwise control the collected light 132. For example, the collection-pathway optics 138 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like). Further, various components of the collection pathway 134 and/or a detector 114 may be configured to select a desired region of interest of the sample 106 for use in a measurement. For example, it may be desirable to select a region of interest within one or more cells 204 to mitigate edge effects or the like. Additionally, the selection of the region of interest and/or the characteristics of features within the region of interest may also be used to control or otherwise determine a frame rate of a detector 114.

The illumination pathway 124 and the collection pathway 134 of the SWIR optical metrology tool 102 may be oriented in a wide range of configurations suitable for illuminating the sample 106 and collecting light emanating from the sample 106 in response to the incident illumination 110. For example, as illustrated in FIG. 1B, the SWIR optical metrology tool 102 may include a beamsplitter 140 oriented such that a common objective lens 130 may simultaneously direct the illumination 110 to the sample 106 and collect light from the sample 106.

Figure 1C:
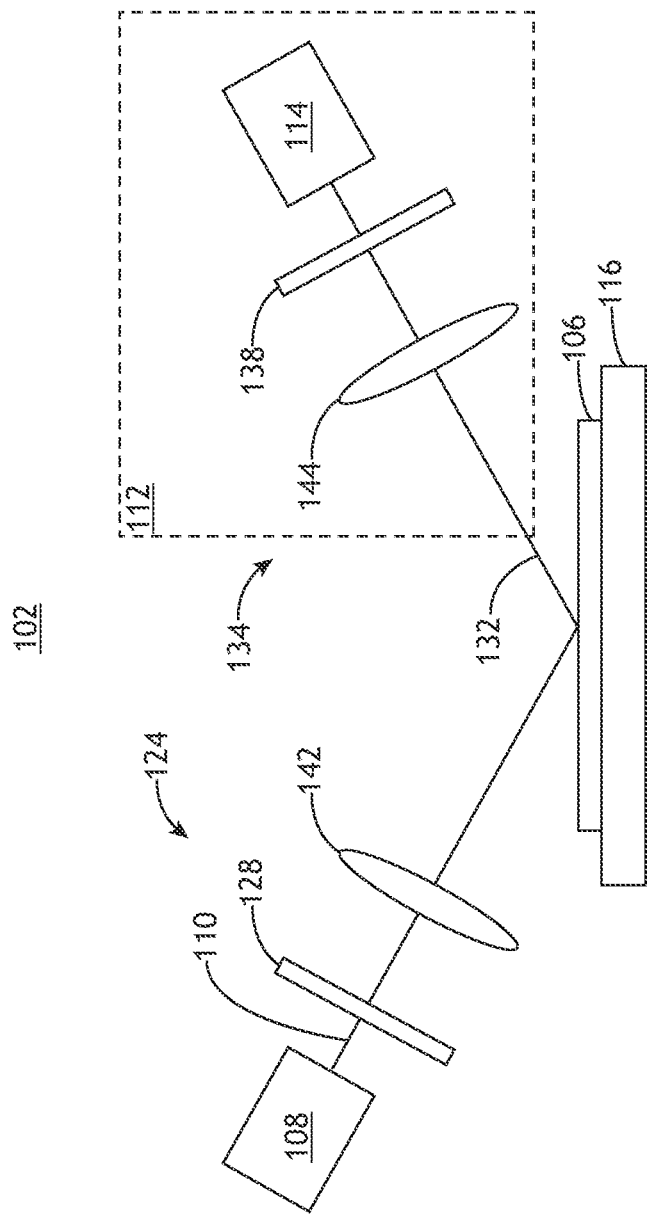
FIG. 1C is a conceptual view of a SWIR optical metrology tool in which an illumination pathway and a collection pathway include separate elements, in accordance with one or more embodiments of the present disclosure.

By way of another example, the illumination pathway 124 and the collection pathway 134 may contain non-overlapping optical paths. FIG. 1C is a conceptual view of a SWIR optical metrology tool 102 in which an illumination pathway 124 and a collection pathway 134 include separate elements, in accordance with one or more embodiments of the present disclosure. For example, the illumination pathway 124 may utilize a first focusing element 142 to direct the illumination 110 to the sample 106 and the collection pathway 134 may utilize a second focusing element 144 to collect light from the sample 106 (e.g., the collected light 132). In this regard, the numerical apertures of the first focusing element 142 and the second focusing element 144 may be different. In another embodiment, one or more optical components may be mounted to one or more rotatable arms (not shown) pivoting around the sample 106 such that the angle of incidence of the illumination 110 on the sample 106 and/or a collection angle may be controlled by the position of the rotatable arms.

Figure 1D:
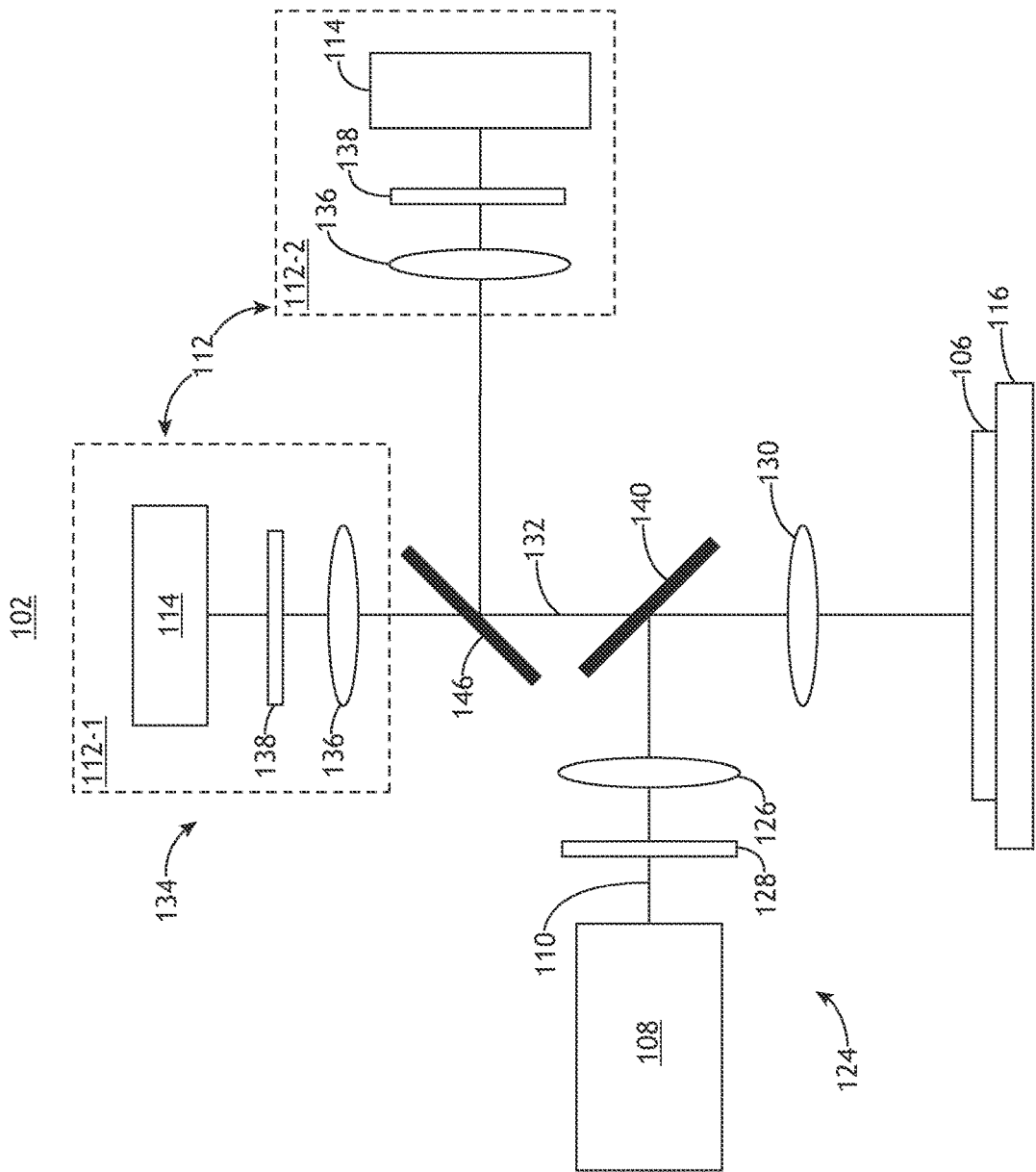
FIG. 1D is a conceptual view of a SWIR optical metrology tool including two measurement channels, where at least one of the measurement channels includes a SWIR detector in accordance with one or more embodiments of the present disclosure.
Figure 1E:
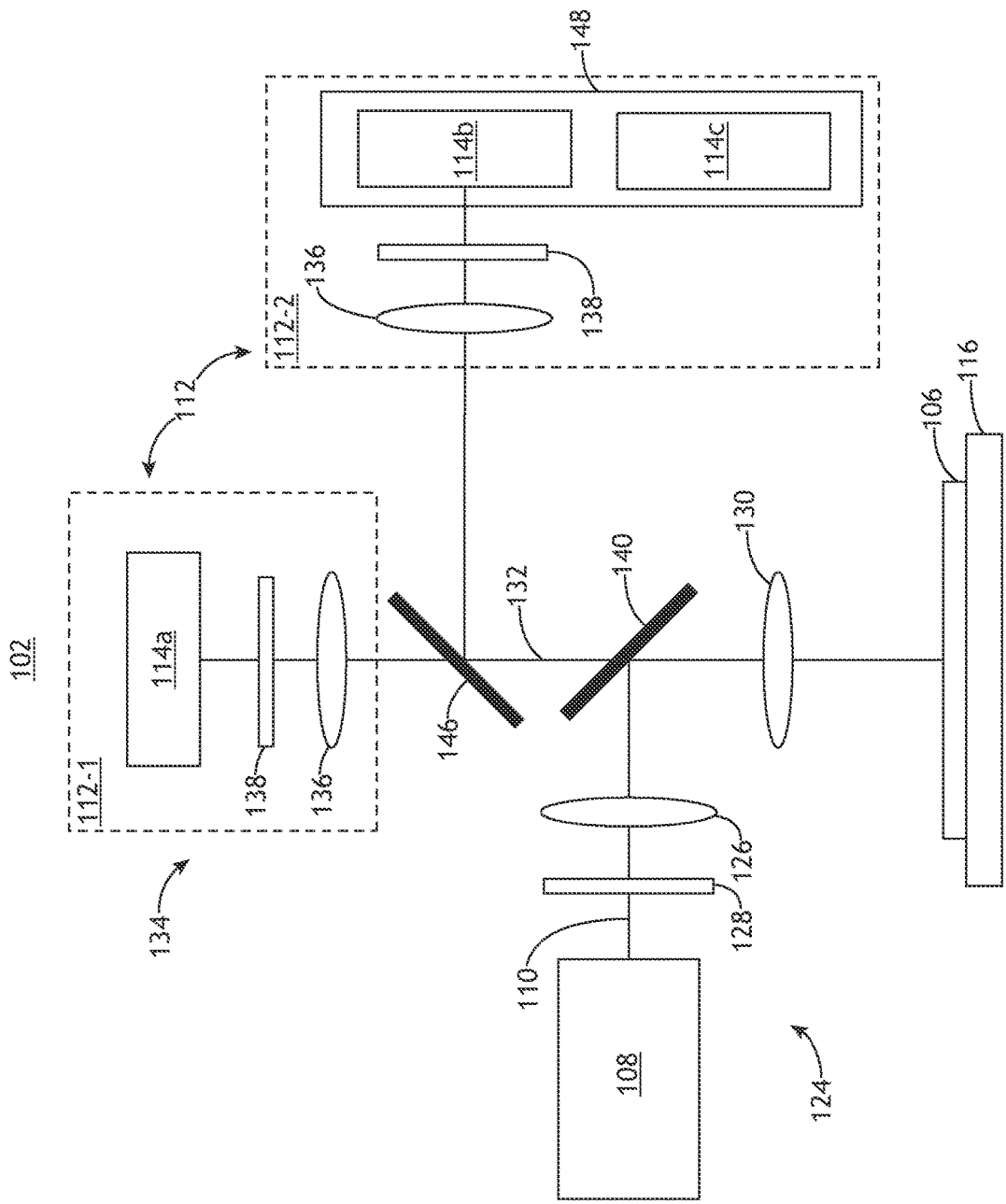
FIG. 1E is a conceptual view of a SWIR optical metrology tool with two measurement channels including a camera changer in one measurement channel to selectively switch between a visible-wavelength detector and a SWIR detector, in accordance with one or more embodiments of the present disclosure.
Figure 1F:
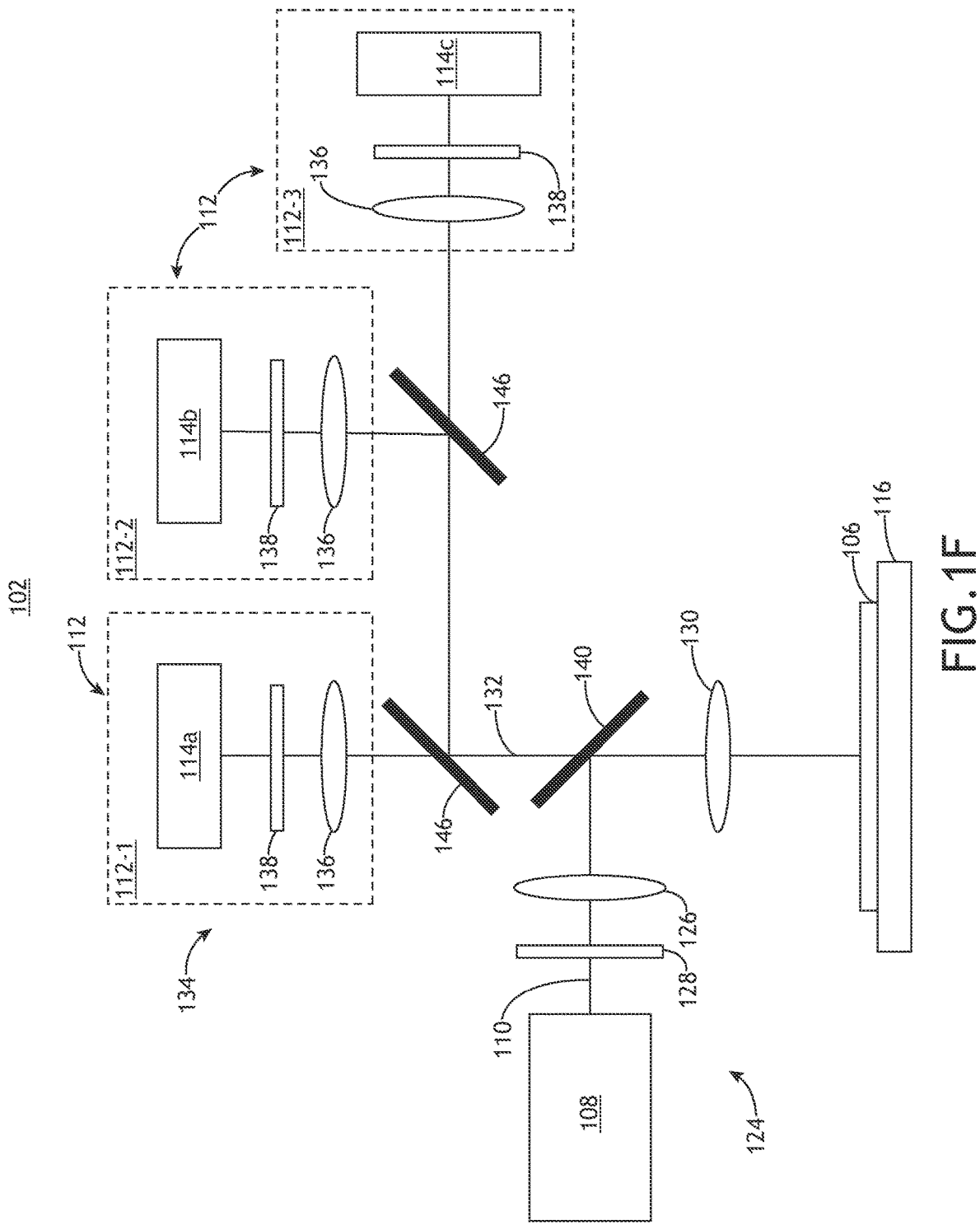
FIG. 1F is a conceptual view of a SWIR optical metrology tool with one measurement channel including a SWIR detector and two measurement channels including visible-wavelength detectors, in accordance with one or more embodiments of the present disclosure.

Referring now to FIGS. 1D-1F, multi-channel configurations of a SWIR optical metrology tool 102 are described in greater detail in accordance with one or more embodiments of the present disclosure. It is noted herein that although some examples provided in FIGS. 1D-1F include visible-wavelength detectors 114, this is provided solely as a non-limiting illustration and such detectors 114 may generally include any detectors 114 suitable for measurements in any non-SWIR spectral ranges including, but not limited to, visible or UV spectral ranges.

FIG. 1D is a conceptual view of a SWIR optical metrology tool 102 including two measurement channels 112, where at least one of the measurement channels 112 includes a SWIR detector 114 in accordance with one or more embodiments of the present disclosure.

In one embodiment, the collection pathway 134 includes one or more channel beamsplitters 146 to split the collected light 132 into two or more paths leading to two or more measurement channels 112 (e.g., measurement channels 112-1 and 112-2). The channel beamsplitters 146 may include any beamsplitting components known in the art. In one embodiment, the channel beamsplitters 146 include a polarization-insensitive beamsplitter. In this way, various measurement channels 112 may receive collected light 132 having any polarization. In another embodiment, the channel beamsplitters 146 include a polarization-sensitive beamsplitter. In this way, particular measurement channels 112 may receive linearly-polarized light with a selected polarization. In another embodiment, the channel beamsplitters 146 include a spectrally-selective beamsplitter such as, but not limited to, a dichroic mirror. For example, a spectrally-selective beamsplitter may direct light above a cutoff wavelength along one path (e.g., to one measurement channel 112 and direct light below the cutoff wavelength along another path (e.g., to another measurement channel 112). Further, multiple spectrally-selective channel beamsplitters 146 or other spectral filters may be combined to provide any selected wavelength range of the collected light 132 to any selected measurement channel 112.

In one embodiment, the SWIR optical metrology tool 102 includes two or more measurement channels 112 including SWIR detectors 114. For example, the channel beamsplitters 146 may be spectrally-insensitive to provide simultaneous or sequential measurements with SWIR wavelengths. For instance, one measurement channel 112 may provide field-plane images of the sample 106 and one measurement channel 112 may provide pupil-plane images of the sample 106. In another instance, different measurement channels 112 may be configured to provide in-focus images of different sample layers. In this way, an optical metrology measurement may be based on the multiple in-focus layers. In another instance, the channel beamsplitters 146 may split light based on a cutoff wavelength in the SWIR spectral range such that each SWIR detector 114 may provide optical metrology data on a different range of SWIR wavelengths.

Further, a measurement channel 112 including a SWIR detector 114 may be configured to provide optical metrology data based on any spectral range including at least one SWIR wavelength. In one embodiment, the SWIR optical metrology tool 102 only directs SWIR wavelengths (e.g., wavelengths greater than approximately 900 nm) to a SWIR detector 114 (e.g., via illumination 110 including only the SWIR wavelengths, via spectrally-sensitive channel beamsplitters 146, via spectral filters, or the like). In another embodiment, the SWIR optical metrology tool 102 directs SWIR wavelengths and at least some visible wavelengths to a SWIR detector 114. In this way, the SWIR detector 114 may operate as a hybrid detector. For example, an InGaAs detector 114 may have comparable or better quantum efficiency than a visible-wavelength detector (e.g., a silicon-based detector) at wavelengths above approximately 700 nm. Accordingly, a SWIR detector 114 may be suitable for use in some visible wavelength ranges.

In another embodiment, the SWIR optical metrology tool 102 includes at least one measurement channel 112 with a SWIR detector 114 and at least one measurement channel 112 with a visible-wavelength detector 114. For example, in a two-channel setup, collected light 132 above a selected cutoff wavelength may be directed (e.g., via illumination 110 including only the SWIR wavelengths, via spectrally-sensitive channel beamsplitters 146, via spectral filters, or the like) to a measurement channel 112 with a SWIR detector 114 and collected light 132 below the selected cutoff wavelength may be directed to the measurement channel 112 with the visible-wavelength detector 114. As described previously herein, the cutoff wavelength may be selected to be any suitable wavelength. In one embodiment, the cutoff wavelength is selected based on the detection limits of the detectors 114 within the SWIR optical metrology tool 102. For example, the cutoff wavelength may be selected to be approximately 900 nm to correspond to an upper detection limit of a visible-wavelength detector 114. In another embodiment, the cutoff wavelength is selected based on the quantum efficiencies of the detectors 114 in the SWIR optical metrology tool 102. For example, the cutoff wavelength may be selected to be a wavelength at which the quantum efficiencies of a visible-wavelength detector 114 and a SWIR detector 114 are equal. For instance, the quantum efficiency of a visible-wavelength detector may generally deteriorate at longer-wavelengths approaching an upper wavelength limit, whereas the quantum efficiency of a SWIR detector 114 may generally increase from a low value in the visible wavelength range to relatively high values in the SWIR wavelength range. As a result, there may generally be a wavelength or range of wavelengths at which a particular visible-wavelength detector 114 and a particular SWIR detector 114 may have equal or similar quantum efficiencies. Accordingly, the cutoff wavelength may be selected to be in this range. It is contemplated herein that selecting a cutoff wavelength based on the quantum efficiencies of the detectors 114 in the SWIR optical metrology tool 102 may provide increased measurement sensitivity and/or accuracy than selection based on detection limits.

A SWIR optical metrology tool 102 including at least one measurement channel 112 with a SWIR detector and at least one measurement channel 112 with a visible-wavelength detector 114 may be suitable for, but is not limited to, optical metrology measurements based on characterization of different layers of a sample 106 with tailored wavelengths. As noted previously herein, metrology with layer-specific illumination spectra is generally described in U.S. Pat. No. 10,444,161 issued on Oct. 15, 2019, which is incorporated by reference in its entirety. In a general sense, metrology based on tailored illumination or collection conditions for different sample layers may provide highly-sensitive measurements. It is further contemplated herein that the systems and methods disclosed herein may extend the techniques described in U.S. Pat. No. 10,444,161 to SWIR wavelengths to provide enhanced sensitivity.

Additionally, the systems and methods disclosed herein may enable measurements on SWIR targets 104 not suitable for optical metrology systems using only visible wavelengths. For example, as described with respect to the SWIR targets 104 in FIGS. 2A-2E, a SWIR optical metrology tool 102 with a first measurement channel 112 including a SWIR detector 114 and a second measurement channel 112 including a visible-wavelength detector 114 (e.g., as illustrated in FIG. 1D) may be suitable for characterizing SWIR targets 104 with a VOIT layer 202. For example, the first measurement channel 112 may generate data associated with a first layer 208 below a VOIT layer 202 and the second measurement channel 112 may generate data associated with a second layer 212 that includes or is above the VOIT layer 202.

Referring now to FIGS. 1E and 1F, configurations of a SWIR optical metrology tool 102 with two measurement channels 112 having visible-wavelength detectors 114 and at least one measurement channel 112 with a SWIR detector 114 are described in greater detail in accordance with one or more embodiments of the present disclosure.

FIG. 1E is a conceptual view of a SWIR optical metrology tool 102 with two measurement channels 112 including a camera changer 148 in one measurement channel 112 (e.g., measurement channels 112-1 and 112-2) to selectively switch between a visible-wavelength detector 114 or other non-SWIR detector (e.g., detector 114b) and a SWIR detector 114 (e.g., detector 114c), in accordance with one or more embodiments of the present disclosure. For example, a first measurement channel 112 (e.g., measurement channel 112-1) may include a first visible-wavelength detector 114a, and a second measurement channel 112 (e.g., measurement channel 112-2) may include the camera changer 148 to selectively switch between a second visible-wavelength detector 114b and a SWIR detector 114c.

The camera changer 148 may include any components known in the art suitable for switching between different detectors 114. In one embodiment, the camera changer 148 includes a translation stage to selectively position a selected detector 114 in an optical path to receive the collected light 132. In another embodiment, the camera changer 148 includes one more adjustable beam-controlling optics to selectively adjust the path of the collected light 132 such as, but not limited to, a polarization rotator coupled with a polarizing beamsplitter, rotatable mirrors, or translatable mirrors.

FIG. 1F is a conceptual view of a SWIR optical metrology tool 102 with one measurement channel 112 including a SWIR detector 114 and two measurement channels 112 including visible-wavelength detectors 114 (or non-SWIR detectors 114 more generally), in accordance with one or more embodiments of the present disclosure. For example, a first measurement channel 112-1 may include a first visible-wavelength detector 114a, a second measurement channel 112-2 may include a second visible-wavelength detector 114b, and a third measurement channel 112-3 may include a SWIR detector 114c.

It is contemplated herein that the configurations illustrated in FIGS. 1E and 1F may provide a convenient and cost-effective upgrade path for existing multi-channel optical metrology systems based on visible wavelengths. Further, such a configuration may facilitate a wide variety of measurement configurations (e.g., metrology recipes) across visible and SWIR wavelengths to provide sensitive and accurate metrology. Additionally, though not shown, it is to be understood that the SWIR optical metrology tool 102 should include (or be upgraded to include) at least one illumination source 108 providing SWIR illumination 110.

Referring now generally to 1A-2E, it is contemplated herein that a SWIR optical metrology system 100 may utilize various operational flows within the spirit and scope of the present disclosure. As an illustrative example in the context of optical metrology such as, but not limited to, overlay metrology, utilizing a SWIR metrology target 104 with a VOIT layer 202 (e.g., as illustrated in FIGS. 2A-2E), the SWIR optical metrology system 100 may be operated in any of multiple modes, either by default or based on the selection of a user or automated system. In one mode, a single SWIR detector 114 is utilized to provide a measurement of one or more layers (or features thereon) below the VOIT layer 202 as well as one or more layers (or features thereon) on or above the VOIT layer 202. In this way, a single image suitable for a metrology measurement may be generated using a single detector 114. In a second mode, two detectors 114 including at least one SWIR detector 114 are operated in parallel to image the various layers (or features thereon). For example, the two detectors 114 may be triggered simultaneously and images generated by the two detectors 114 may be, but are not required to be, stitched together into a single composite image or file. Further, a single composite metrology measurement may be generated based on the two images or a stitched composite of the two images. In a third mode, two detectors 114 including at least one SWIR detector 114 are operated in parallel (e.g., similar to the second mode), but each image may be used as the source of a metrology measurement. In this way, the SWIR optical metrology system 100 may operate as two separate tools operating in parallel. Additionally, in any mode, only particular regions of interest in any given image may be isolated as the source of a measurement. It is to be understood, however, that the descriptions of these three exemplary modes are provided solely for illustrative purposes and should not be interpreted as limiting. Rather, a wide variety of operational modes are achievable based on the various configurations of a SWIR optical metrology system 100 as disclosed herein.

Figure 3:
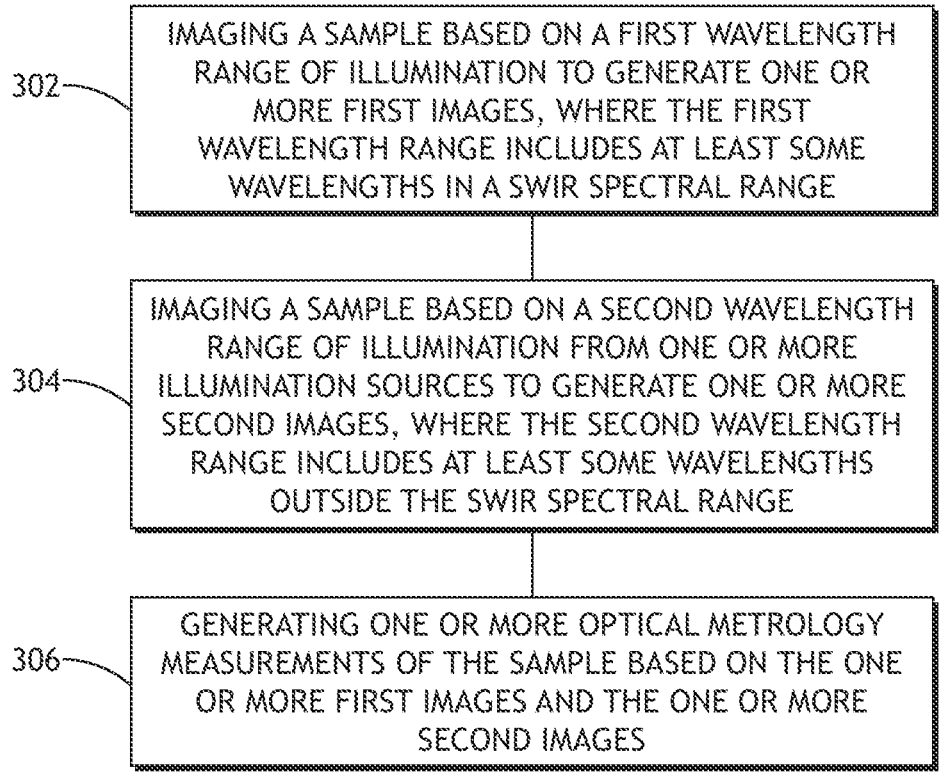
FIG. 3 is a flow diagram illustrating steps performed in a SWIR overlay method in accordance with one or more embodiments of the present disclosure.

FIG. 3 is a flow diagram illustrating steps performed in a SWIR optical metrology method 300 in accordance with one or more embodiments of the present disclosure. Applicant notes that the embodiments and enabling technologies described previously herein in the context of the SWIR optical metrology system 100 and/or a SWIR metrology target 104 should be interpreted to extend to method 300. It is further noted, however, that the method 300 is not limited to the architecture of the SWIR optical metrology system 100 or the SWIR metrology target 104.

In one embodiment, the method 300 includes a step 302 of imaging a sample based on a first wavelength range of illumination to generate one or more first images, where the first wavelength range includes at least some wavelengths in a SWIR spectral range. In another embodiment, the method 300 includes a step 304 of imaging a sample based on a second wavelength range of illumination from one or more illumination sources to generate one or more second images, where the second wavelength range includes at least some wavelengths outside the SWIR spectral range (e.g., visible wavelengths, UV wavelengths, or the like). In another embodiment, the method 300 includes a step 306 of generating one or more optical metrology measurements of the sample based on the one or more first images and the one or more second images. In this regard, the method 300 may extend optical metrology techniques to SWIR wavelengths.

For example, the method 300 may be suitable for measuring overlay on overlay targets including features on one or more sample layers on or below a VOIT layer. For instance, the step 302 may provide an image or other overlay data of one or more features below a VOIT layer and the step 304 may provide an image or other overlay data of one or more features on or above the VOIT layer. The step 306 may then combine the images or other overlay data to provide the one or more optical metrology measurements. For instance, the one or more first images may be used to generate one or more first optical metrology measurements and the one or more second images may be used to generate one or more second optical metrology measurements. In this case the separate measurements based on the different wavelength ranges may be used to generate a final measurement. In another instance, the first and second images may be combined or stitched such that a single optical metrology measurement may be generated based on the combined or stitched images.

It is to be understood that the method 300 is provided solely for illustrative purposes and should not be interpreted as limiting. For example, the method 300 illustrates a specific non-limiting case of image-based optical metrology. It is contemplated herein that additional methods associated with non-imaging optical metrology techniques are also within the spirit and scope of the present disclosure. In one embodiment, an optical metrology measurement is based on a combination of one or more first optical metrology measurements based on illumination with at least some wavelengths in a SWIR spectral range one or more second optical metrology measurements based on illumination with at least some wavelengths outside the SWIR spectral range. For example, the one or more first optical metrology measurements and/or the one or more second optical metrology measurements may be, but are not required to be, scatterometry-based optical metrology measurements.

Additionally, although many of the examples associated with the SWIR optical metrology system 100, the SWIR metrology target 104, or the method 300 are based on illumination including wavelengths in a SWIR spectral range and illumination including wavelengths outside the SWIR spectral range, these examples are provided solely for illustrative purposes. For example, the SWIR optical metrology system may generate one or more measurements using only SWIR wavelengths, a SWIR metrology target 104 may be characterized solely with SWIR wavelengths.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An optical metrology tool comprising:
one or more illumination sources, wherein at least one of the one or more illumination sources is configured to generate illumination in a short-wave infrared (SWIR) spectral range, wherein at least one of the one or more illumination sources is configured to generate illumination outside the SWIR spectral range;
one or more illumination optics configured to direct illumination from the one or more illumination sources to a sample;
a first imaging channel including a first detector configured to image the sample based on illumination with a first wavelength range, wherein the first wavelength range includes at least some wavelengths in the SWIR spectral range from the one or more illumination sources;
a second imaging channel including a second detector configured to image the sample based on illumination with a second wavelength range different than the first wavelength range, wherein the second wavelength range includes at least some wavelengths outside the SWIR spectral range from the one or more illumination sources, wherein the first and second wavelength ranges are non-overlapping and are separated by a cutoff wavelength, wherein the first wavelength range includes wavelengths above the cutoff wavelength, wherein the second wavelength range includes wavelengths below the cutoff wavelength, wherein the cutoff wavelength corresponds to a wavelength at which a quantum efficiency of the first detector and a quantum efficiency of the second detector are equal; and a controller communicatively coupled to first and second detectors, the controller including one or more processors configured to execute program instructions causing the one or more processors to:

receive one or more first images of the sample from the first detector;

receive one or more second images of the sample from the second detector; and generate one or more optical metrology measurements of the sample based on the one or more first images and the one or more second images.

2. The optical metrology tool of claim 1, wherein the second wavelength range includes at least one of visible wavelengths or ultraviolet wavelengths.

3. The optical metrology tool of claim 1, wherein the optical metrology measurement comprises:

at least one of an overlay metrology measurement or an optical critical dimension metrology measurement.

4. The optical metrology tool of claim 1, wherein the one or more optical metrology measurements comprise:

one or more first optical metrology measurements based on the one or more first images; and one or more second optical metrology measurements based on the one or more second images.

5. The optical metrology tool of claim 1, wherein the cutoff wavelength is in a range of 700 nm to 1100 nm.

6. The optical metrology tool of claim 1, wherein the one or more illumination sources comprise:

a first illumination source configured to generate illumination in the first wavelength range; and a second illumination source configured to generate illumination in the second wavelength range.

7. The optical metrology tool of claim 1, wherein the one or more illumination sources comprise:

a single illumination source configured to generate illumination in the first and second wavelength ranges.

8. The optical metrology tool of claim 1, wherein the one or more illumination sources comprise:

at least one of a plasma source, a narrowband laser source, or a supercontinuum laser source.

9. The optical metrology tool of claim 1, further comprising:

one or more beamsplitters to direct light from the sample in the first wavelength range to the first imaging channel and to direct light from the sample in the second wavelength range to the second imaging channel.

10. The optical metrology tool of claim 1, wherein at least one of the one or more optical metrology measurements comprises a composite optical metrology measurement based on at least one of the one or more first images and at least one of the one or more second images, wherein the at least one of the one or more first images and at least one of the one or more second images are combined into a composite image prior to generating the composite optical metrology measurement.

11. The optical metrology tool of claim 1, wherein the one or more first images from the first detector include pupil-plane images of an angular distribution of light from a first layer of the sample, wherein the one or more second images from the second detector include pupil-plane images of an angular distribution of light from a second layer of the sample.

12. The optical metrology tool of claim 11, wherein at least one of the one or more first images or the one or more second images include images of a metrology target, wherein the metrology target comprises:

a scatterometry target.

13. The optical metrology tool of claim 1, wherein the first detector comprises:

at least one of an indium-gallium-arsenide (InGaAs) detector or a mercury- cadmium-telluride (HgCdTe) detector.

14. The optical metrology tool of claim 13, wherein the second detector comprises:

at least one of a silicon or a Gallium-Arsenide (GaAs) detector.

15. The optical metrology tool of claim 13, wherein the second detector comprises:

at least one of an InGaAs detector or a HgCdTe detector.

16. The optical metrology tool of claim 1, wherein the one or more first images from the first detector include field-plane images of features on a first layer of the sample, wherein the one or more second images from the second detector include field-plane images of features on a second layer of the sample.

17. The optical metrology tool of claim 16, wherein the first layer of the sample is the same as the second layer of the sample.

18. The optical metrology tool of claim 16, wherein at least one of the one or more first images or the one or more second images include images of a metrology target.

19. The optical metrology tool of claim 18, wherein the metrology target comprises:

an imaging optical target.

20. The optical metrology tool of claim 19, wherein the imaging optical target comprises:

an advanced imaging metrology (AIM) overlay target.

21. The optical metrology tool of claim 16, wherein the first layer of the sample is below the second layer of the sample.

22. The optical metrology tool of claim 21, wherein the second layer absorbs at least some wavelengths in the second wavelength range and transmits at least some wavelengths in the first wavelength range.

23. The optical metrology tool of claim 21, wherein the first layer of the sample comprises:

a process layer formed from one or more materials common to device features on the first layer.

24. The optical metrology tool of claim 23, wherein the second layer of the sample comprises:

a resist layer.

25. The optical metrology tool of claim 23, wherein the second layer of the sample comprises:

an additional process layer formed from one or more materials common to device features on the second layer.

26. An optical metrology tool comprising:

one or more illumination sources, wherein at least one of the one or more illumination sources is configured to generate illumination in a short-wave infrared (SWIR) spectral range, wherein at least one of the one or more illumination sources is configured to generate illumination outside the SWIR spectral range;
one or more illumination optics configured to direct illumination from the one or more illumination sources to a sample;
a first imaging channel, the first imaging channel including a first detector configured to image the sample based on illumination with a first wavelength range, wherein the first wavelength range includes at least some wavelengths in the SWIR spectral range from the one or more illumination sources, the first imaging channel further including a second detector configured to image the sample based on illumination with a second wavelength range different than the first wavelength range, wherein the second wavelength range includes at least some wavelengths outside the SWIR spectral range from the one or more illumination sources, wherein the first detector and the second detector are mounted on a camera changer to selectively position the first detector or the second detector in a collection path for imaging the sample;
a second imaging channel including a third detector configured to image the sample based on illumination with a third wavelength range different than the first wavelength range, wherein the third wavelength range includes at least some wavelengths outside the SWIR spectral range from the one or more illumination sources; and
a controller communicatively coupled to first and second detectors, the controller including one or more processors configured to execute program instructions causing the one or more processors to:
receive one or more first images of the sample from the first detector;
receive one or more second images of the sample from the second detector;
receive one or more third images of the sample from the third detector; and
generate one or more optical metrology measurements of the sample based on the one or more first images, the one or more second images, and the one or more third images.

27. The optical metrology tool of claim 26, wherein at least one of the second wavelength range or the third wavelength range includes at least one of visible wavelengths or ultraviolet wavelengths.

28. The optical metrology tool of claim 26, wherein the one or more optical metrology measurements comprise:
at least one of an overlay metrology measurement or an optical critical dimension metrology measurement.

29. The optical metrology tool of claim 26, wherein the one or more first images from the first detector include images of features on a first layer of the sample, wherein at least one of the one or more second images from the second detector or the one or more third images from the third detector include images of features on a second layer of the sample.

30. The optical metrology tool of claim 26, wherein the first detector comprises:
at least one of an InGaAs detector or a mercury-cadmium-telluride detector.

31. The optical metrology tool of claim 30, wherein the second detector comprises:
at least one of a silicon or a GaAs detector.

32. The optical metrology tool of claim 26, wherein the first and second wavelength ranges are non-overlapping and are separated by a cutoff wavelength, wherein the first wavelength range includes wavelengths above the cutoff wavelength, wherein the second wavelength range includes wavelengths below the cutoff wavelength.

33. The optical metrology tool of claim 32, wherein the cutoff wavelength is in a range of 700 nm to 1100 nm.

34. An optical metrology tool comprising:
one or more illumination sources, wherein at least one of the one or more illumination sources is configured to generate illumination in a short-wave infrared (SWIR) spectral range, wherein at least one of the one or more illumination sources is configured to generate illumination outside the SWIR spectral range;
one or more illumination optics configured to direct illumination from the one or more illumination sources to a sample;
a first detector sensitive to illumination within a first wavelength range including at least some wavelengths in the SWIR spectral range generated by the one or more illumination sources and a second detector sensitive to illumination within a second wavelength range including at least some wavelengths outside the SWIR spectral range generated by the one or more illumination sources, wherein the first and second wavelength ranges are non-overlapping and are separated by a cutoff wavelength, wherein the first wavelength range includes wavelengths above the cutoff wavelength, wherein the second wavelength range includes wavelengths below the cutoff wavelength, wherein the cutoff wavelength corresponds to a wavelength at which a quantum efficiency of the first detector and a quantum efficiency of the second detector are equal;
a controller communicatively coupled to the first detector and the second detector, the controller including one or more processors configured to execute program instructions causing the one or more processors to:
receive one or more first images of the sample from the first detector based on illumination with the at least some wavelengths in the SWIR spectral range generated by the one or more illumination sources;
receive one or more second images of the sample from the second detector based on illumination with the at least some wavelengths outside the SWIR spectral range generated by the one or more illumination sources; and
generate one or more optical metrology measurements of the sample based on the one or more first images and the one or more second images.

35. The optical metrology tool of claim 34, wherein the first detector is sensitive to wavelengths greater than 700 nm.

36. The optical metrology tool of claim 34, wherein at least one of the one or more optical metrology measurements comprises a composite optical metrology measurement based on at least one of the one or more first images and at least one of the one or more second images, wherein the at least one of the one or more first images and at least one of the one or more second images are combined into a composite image prior to generating the composite optical metrology measurement.

37. The optical metrology tool of claim 34, wherein the one or more first images from the first detector include field-plane images of features on a first layer of the sample, wherein the one or more second images from the second detector include field-plane images of features on a second layer of the sample, wherein the first layer of the sample is below the second layer of the sample, wherein the second layer absorbs at least some of the wavelengths outside the SWIR spectral range.

38. The optical metrology tool of claim 37, wherein the first layer of the sample comprises:
   a process layer formed from one or more materials common to device features on the first layer, wherein the second layer of the sample comprises:
   a resist layer.

* * * * *